(12) United States Patent
Kato

(10) Patent No.: US 12,199,032 B2
(45) Date of Patent: Jan. 14, 2025

(54) SEMICONDUCTOR MEMORY DEVICE WITH THREE-DIMENSIONALLY STACKED MEMORY CELLS HAVING IMPROVED YIELD

(71) Applicant: KIOXIA CORPORATION, Tokyo (JP)

(72) Inventor: Hisashi Kato, Yokkaichi (JP)

(73) Assignee: KIOXIA CORPORATION, Tokyo (JP)

( * ) Notice: Subject to any disclaimer, the term of this patent is extended or adjusted under 35 U.S.C. 154(b) by 109 days.

(21) Appl. No.: 17/667,955

(22) Filed: Feb. 9, 2022

(65) Prior Publication Data

US 2022/0173032 A1 Jun. 2, 2022

Related U.S. Application Data

(63) Continuation of application No. 16/567,153, filed on Sep. 11, 2019, now Pat. No. 11,282,782.

(30) Foreign Application Priority Data

Mar. 19, 2019 (JP) .................................. 2019-051563

(51) Int. Cl.
| | | |
|---|---|---|
| H01L 23/522 | (2006.01) | |
| H01L 23/528 | (2006.01) | |
| H10B 43/27 | (2023.01) | |
| H10B 43/35 | (2023.01) | |

(52) U.S. Cl.
CPC ...... H01L 23/5226 (2013.01); H01L 23/5283 (2013.01); H10B 43/27 (2023.02); H10B 43/35 (2023.02)

(58) Field of Classification Search
CPC ............. H01L 23/5226; H01L 23/5283; H01L 257/019; H01B 43/35; H01B 43/27
USPC .......................................................... 257/19
See application file for complete search history.

(56) References Cited

U.S. PATENT DOCUMENTS

| | | | |
|---|---|---|---|
| 9,773,803 B2 | 9/2017 | Tsuji et al. | |
| 2012/0098139 A1 | 4/2012 | Chae | |
| 2016/0307910 A1 | 10/2016 | Son | |
| 2017/0117289 A1* | 4/2017 | Liu | H10B 41/27 |
| 2017/0162591 A1* | 6/2017 | Choi | H10B 41/27 |
| 2017/0207226 A1* | 7/2017 | Lee | H10B 41/27 |
| 2017/0323900 A1* | 11/2017 | Kanamori | H10B 43/10 |

(Continued)

FOREIGN PATENT DOCUMENTS

JP 2018-160529 A 10/2018

*Primary Examiner* — Sheng-Bai Zhu
(74) *Attorney, Agent, or Firm* — Oblon, McClelland, Maier & Neustadt, L.L.P.

(57) ABSTRACT

According to one embodiment, a semiconductor memory device includes first and second conductor layers, a first pillar, a first contact, and a source line drive circuit. The first pillar is passing through the second conductor layers. The first pillar includes a first semiconductor layer and a second insulator layer. The first semiconductor layer includes a side surface partially in contact with the first conductor layer. The first contact is passing through the second conductor layers. The first contact includes a third conductor layer and a third insulator layer. The third conductor layer includes a side surface partially in contact with the first conductor layer. The source line drive circuit is electrically coupled to the first conductor layer via the first contact.

20 Claims, 28 Drawing Sheets

(56) References Cited

U.S. PATENT DOCUMENTS

| | | | |
|---|---|---|---|
| 2018/0006052 A1* | 1/2018 | Hwang | H01L 21/76879 |
| 2018/0151672 A1* | 5/2018 | Choi | H01L 29/1037 |
| 2018/0277477 A1 | 9/2018 | Ishihara | |
| 2019/0067314 A1 | 2/2019 | Lu | |
| 2019/0181226 A1* | 6/2019 | Choi | H10B 43/50 |

* cited by examiner

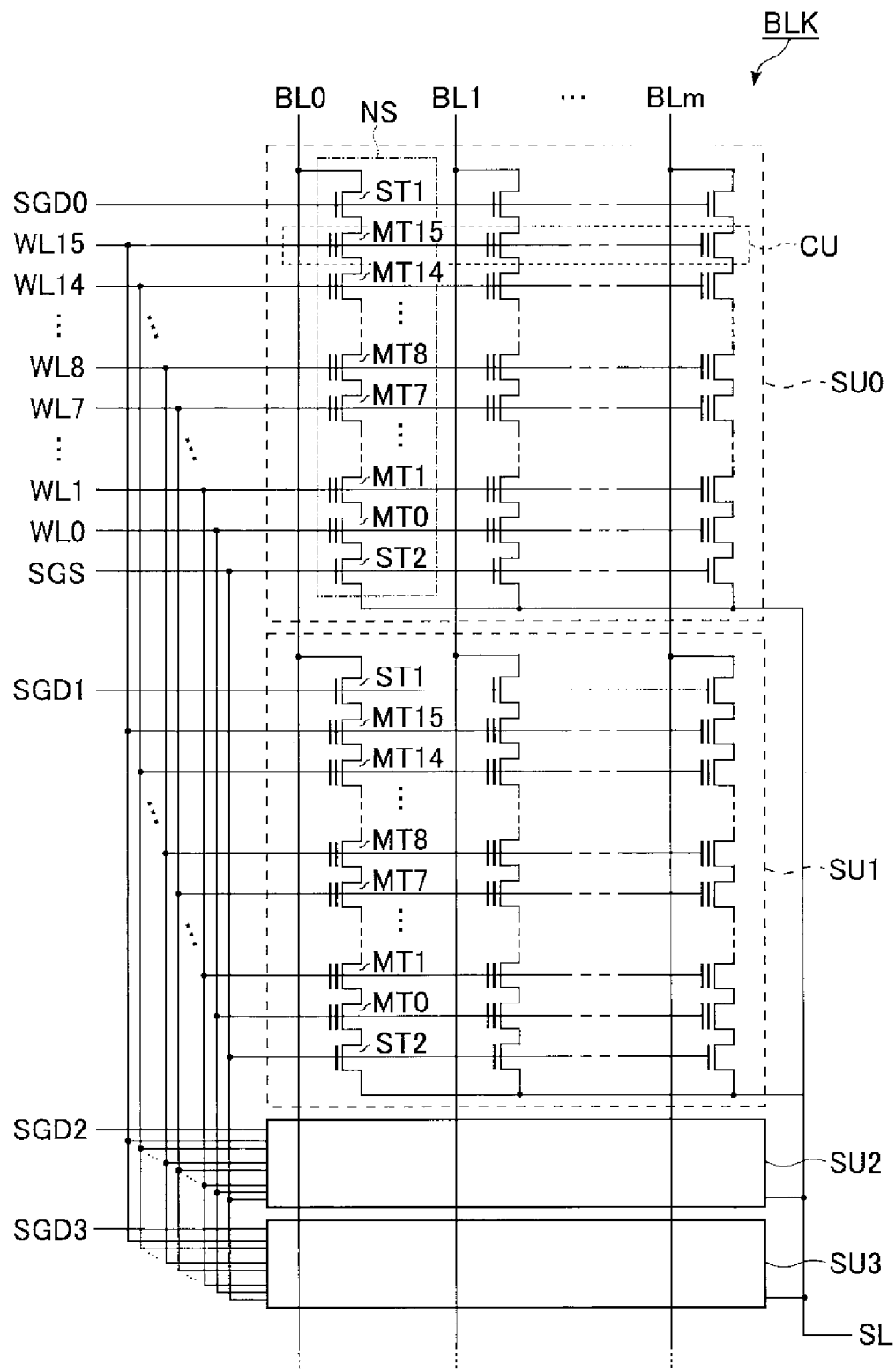
F I G. 2

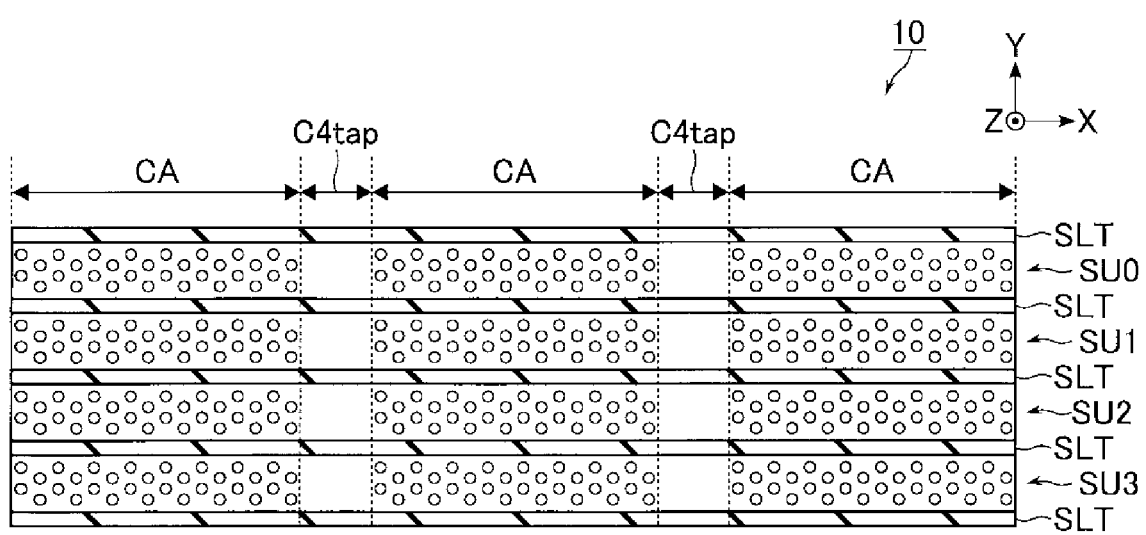
F I G. 3

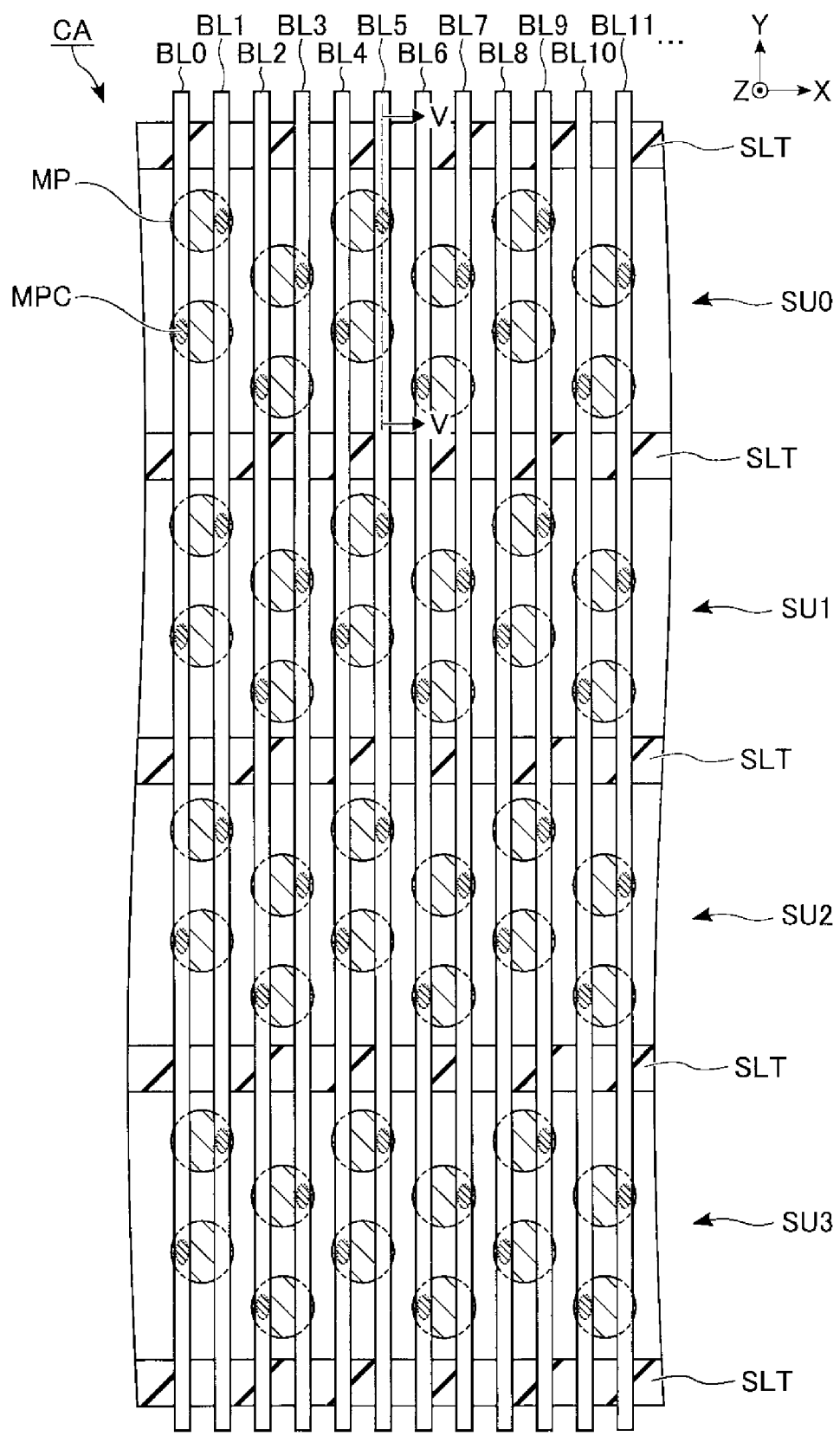
F I G. 4

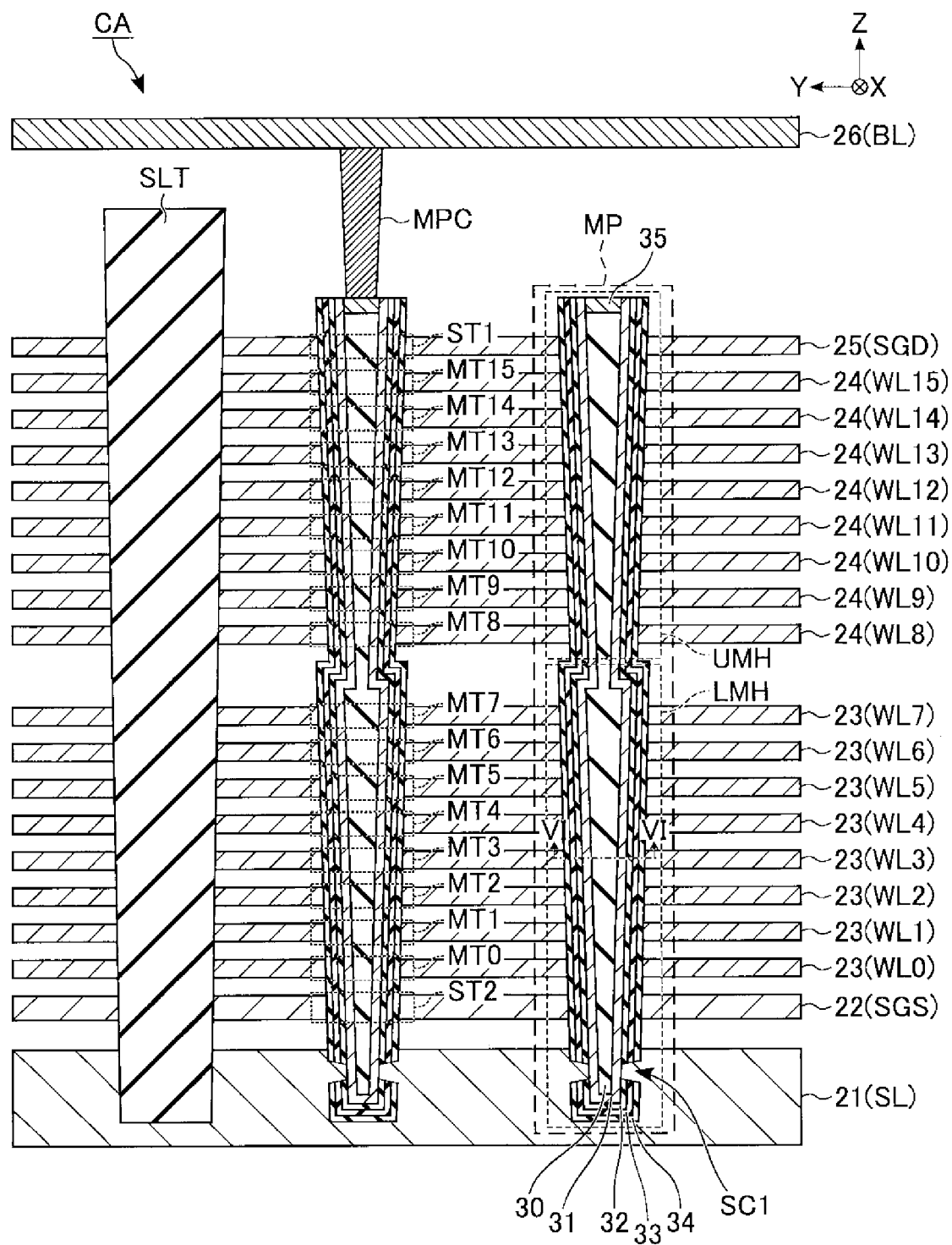
F I G. 5

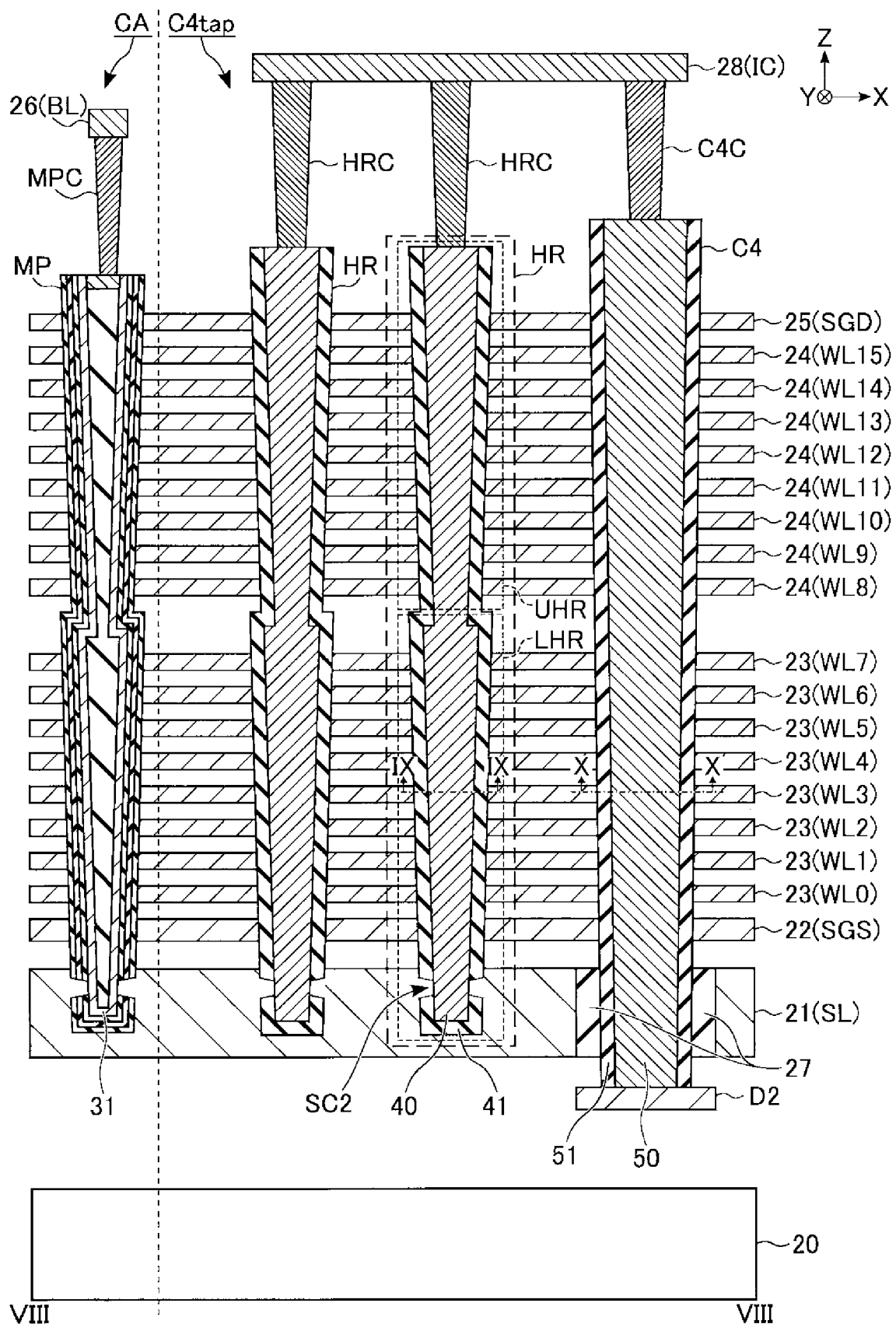
F I G. 8

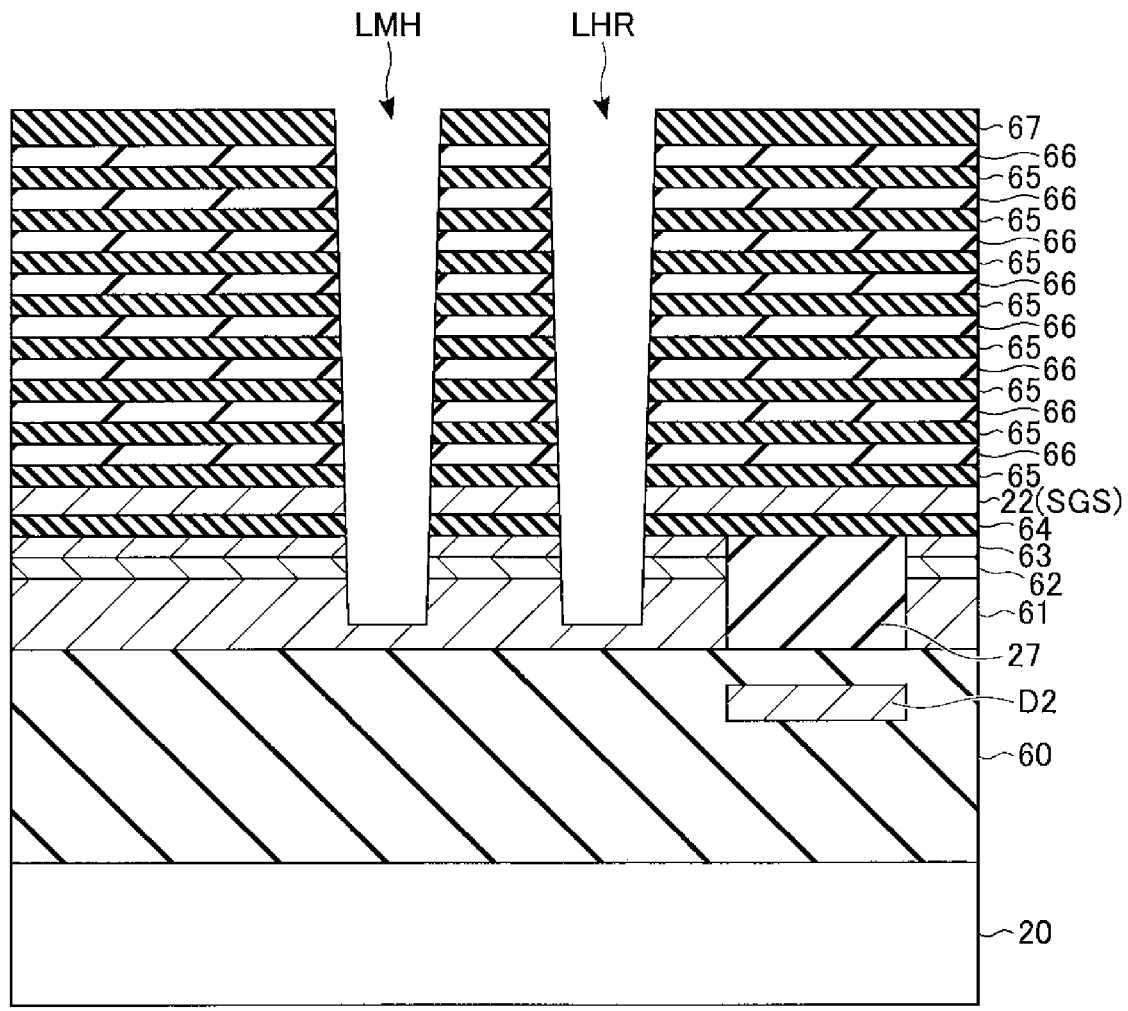
F I G. 13

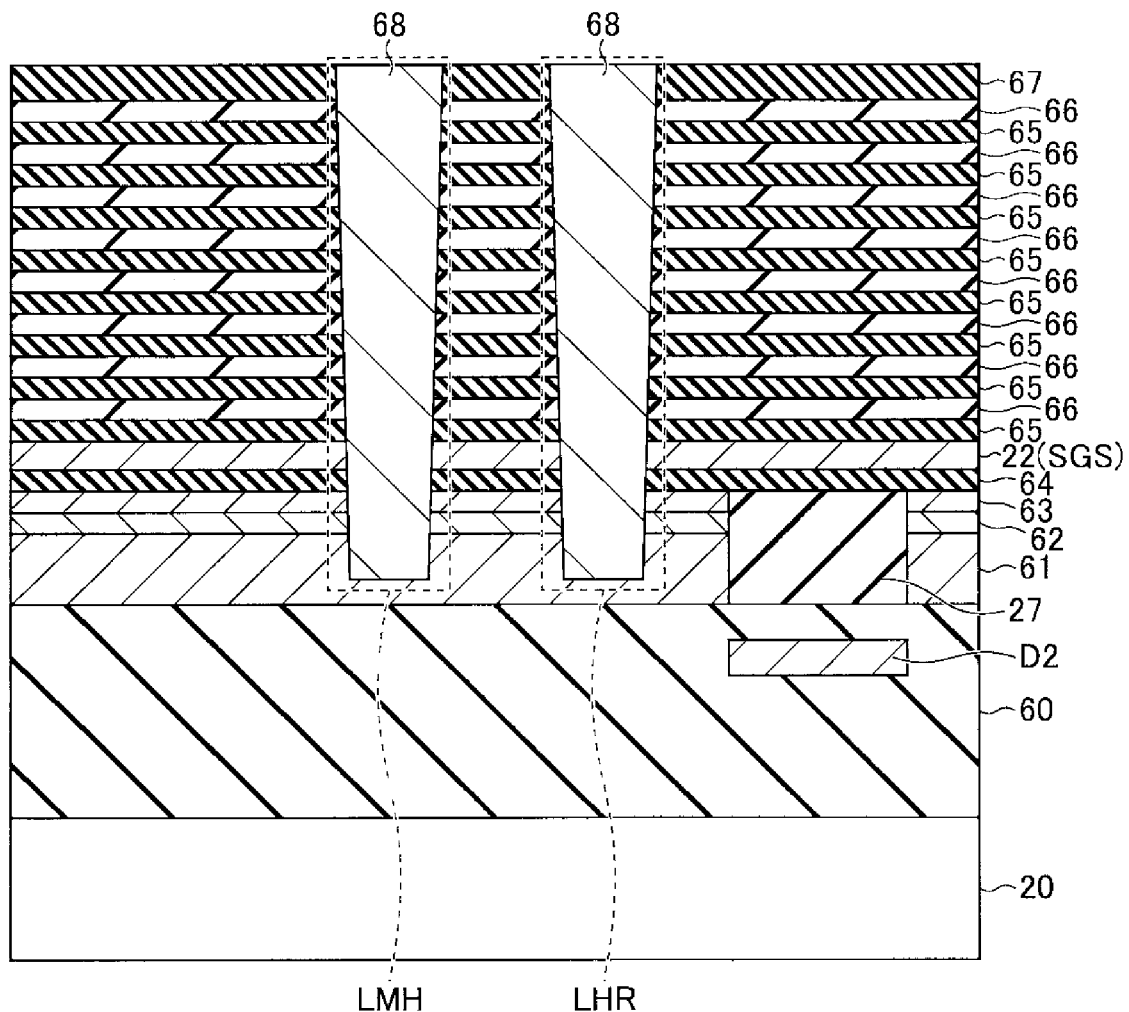
F I G. 14

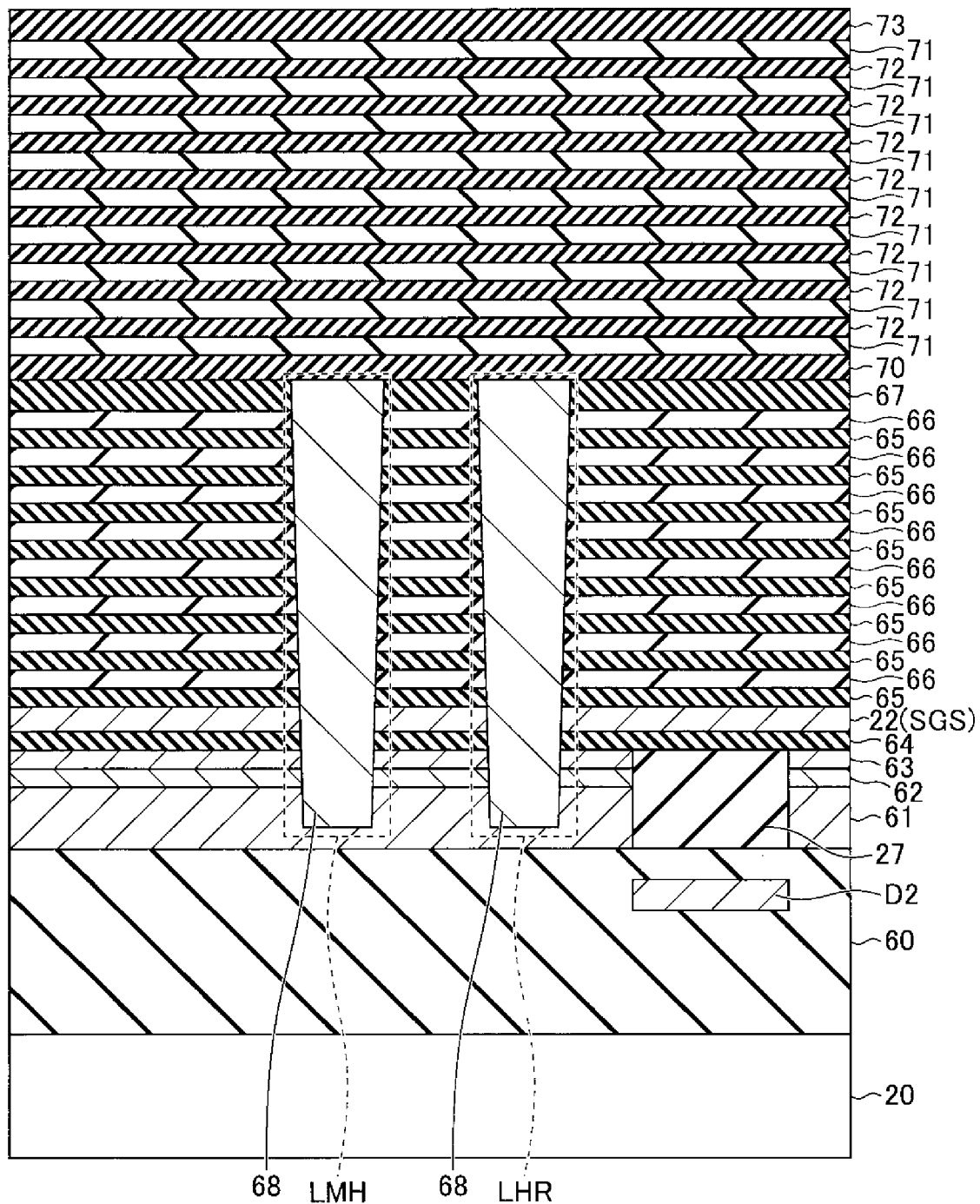
F I G. 15

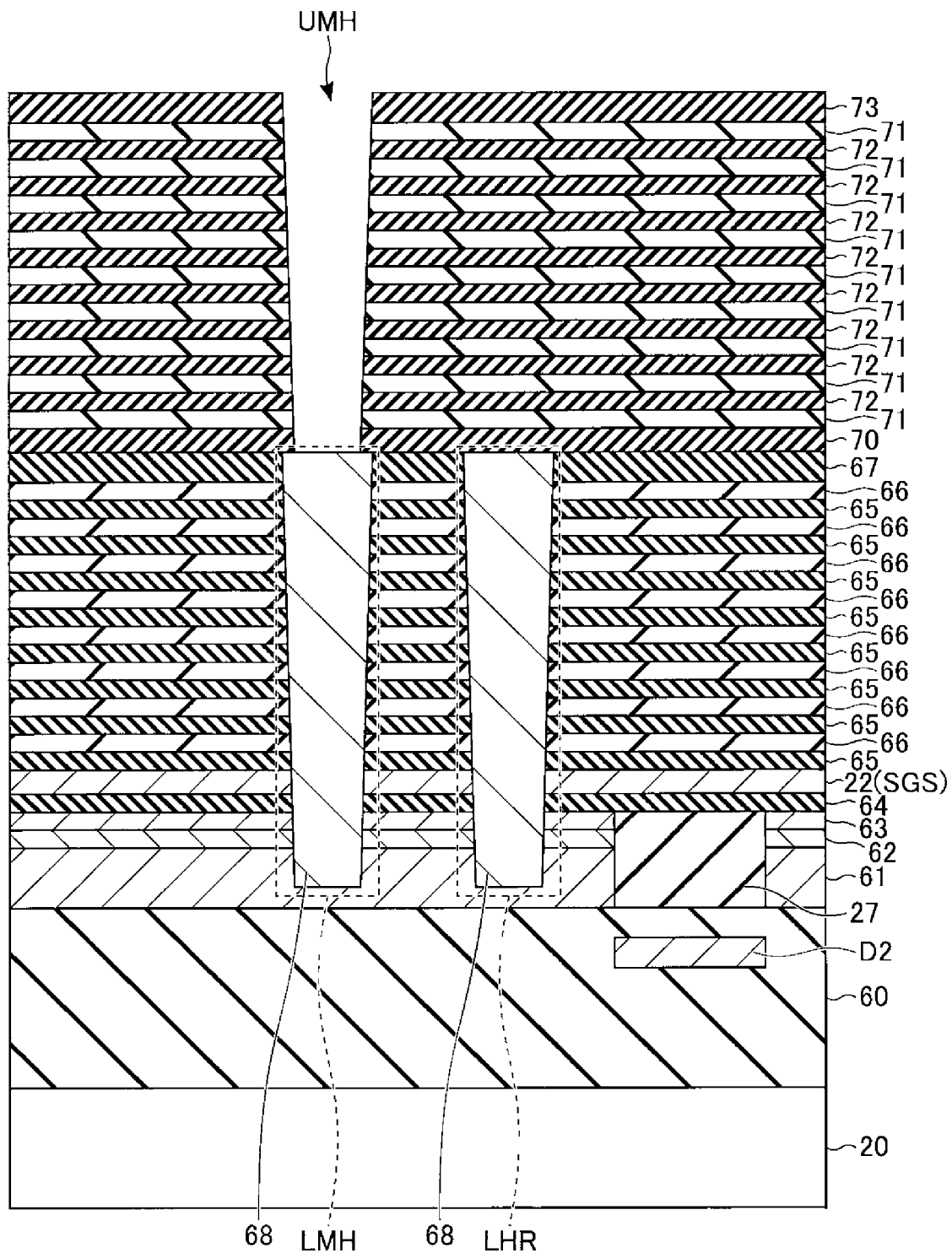
F I G. 16

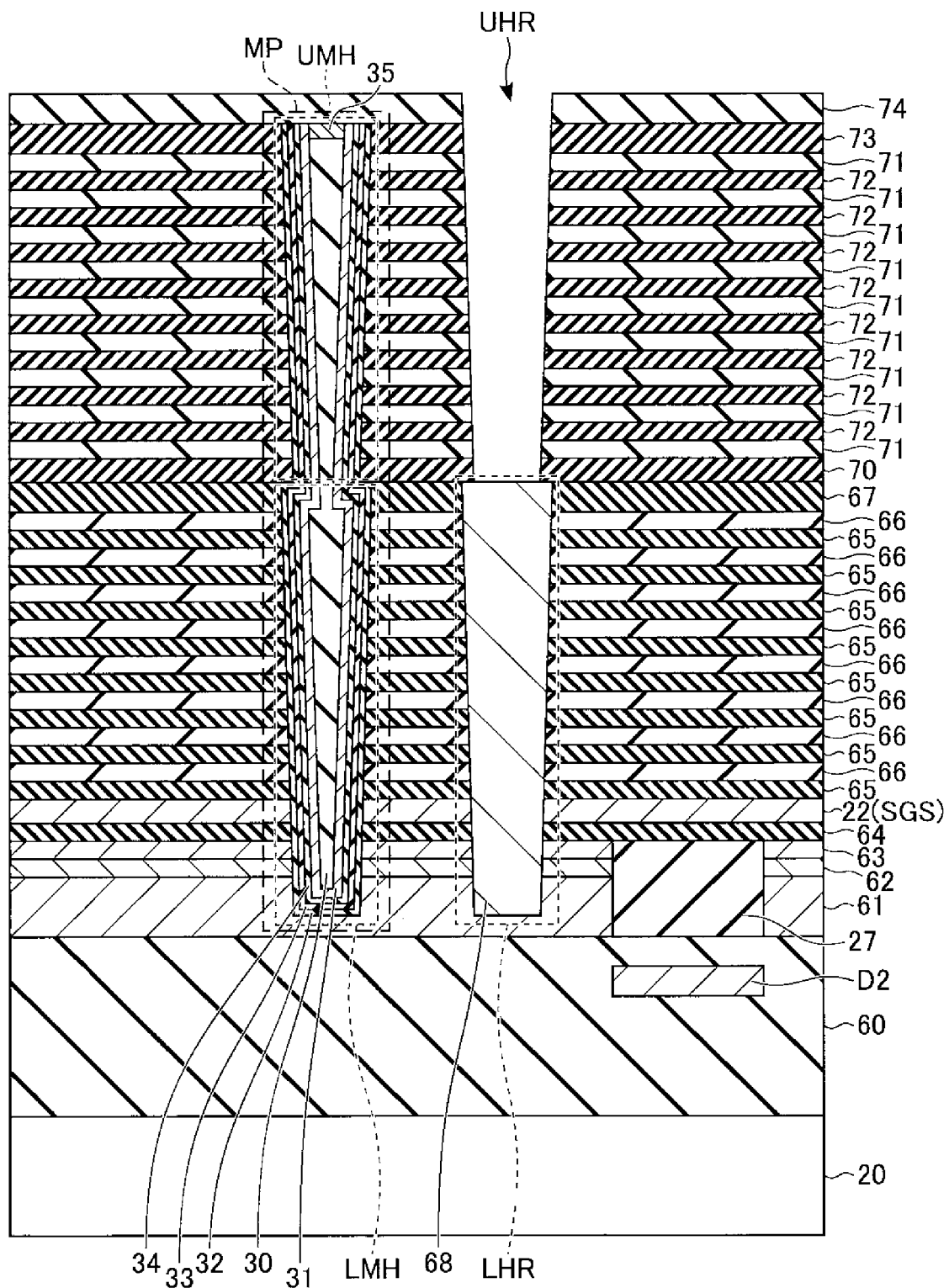
F I G. 18

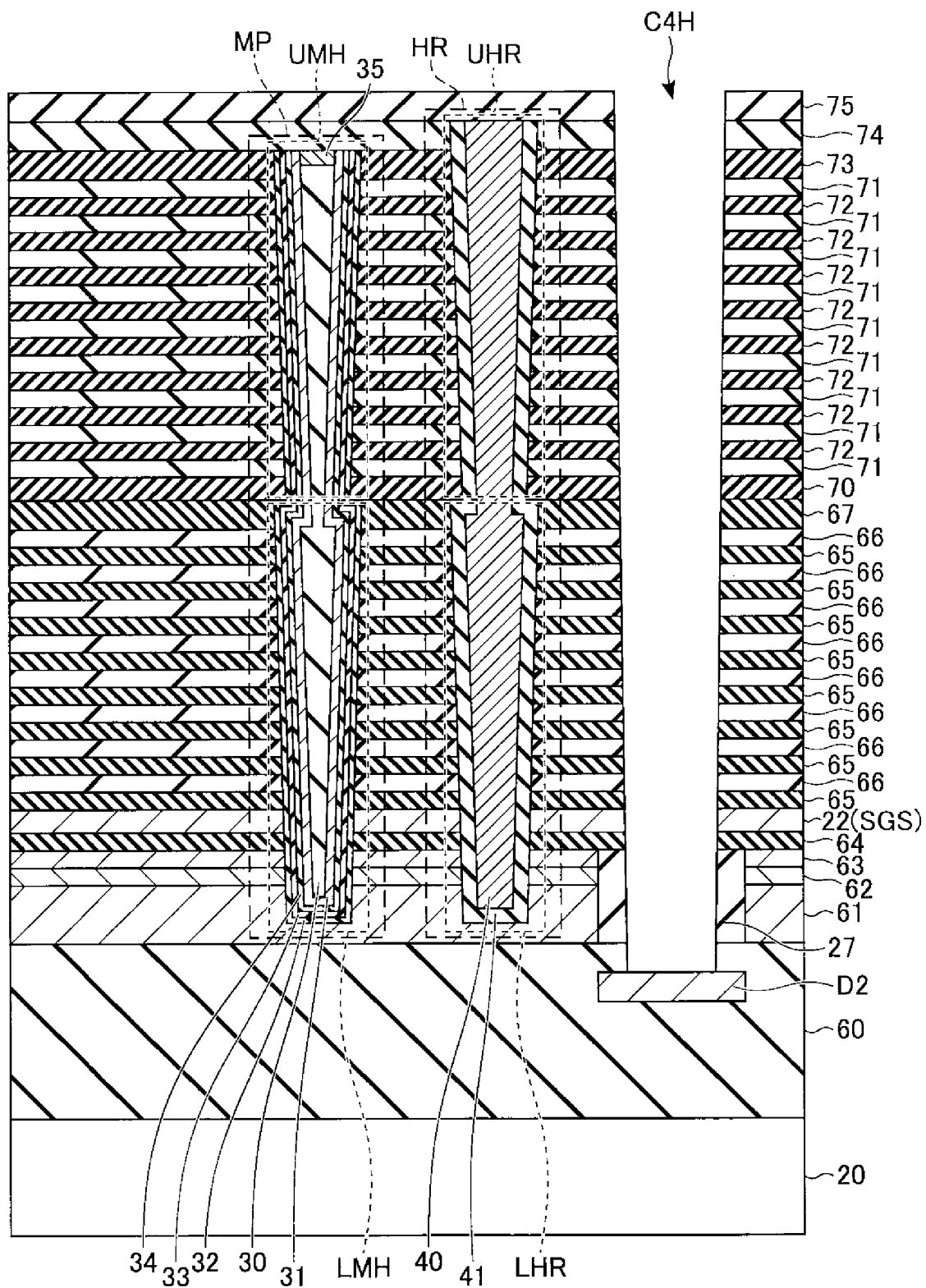
F I G. 20

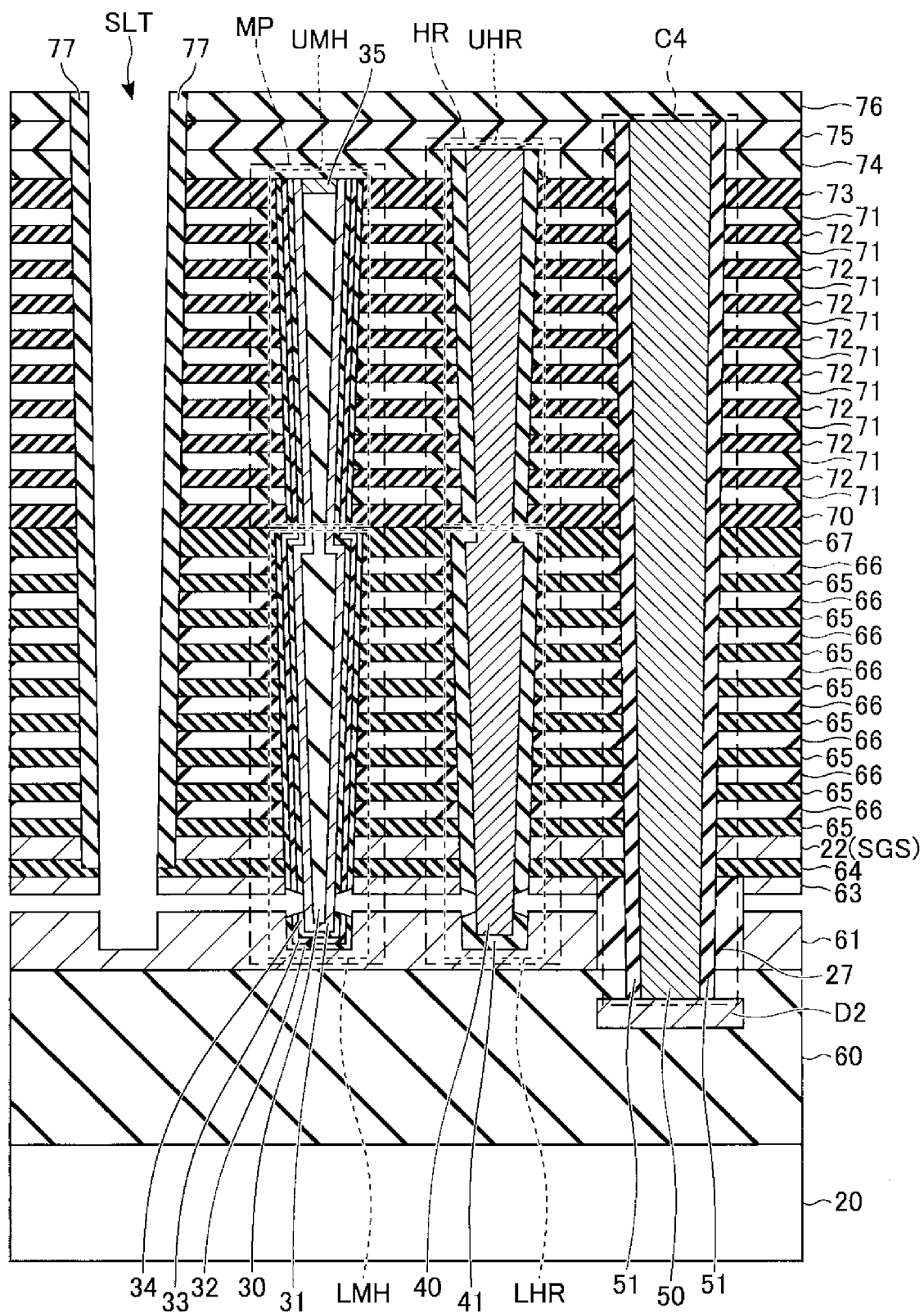
F I G. 24

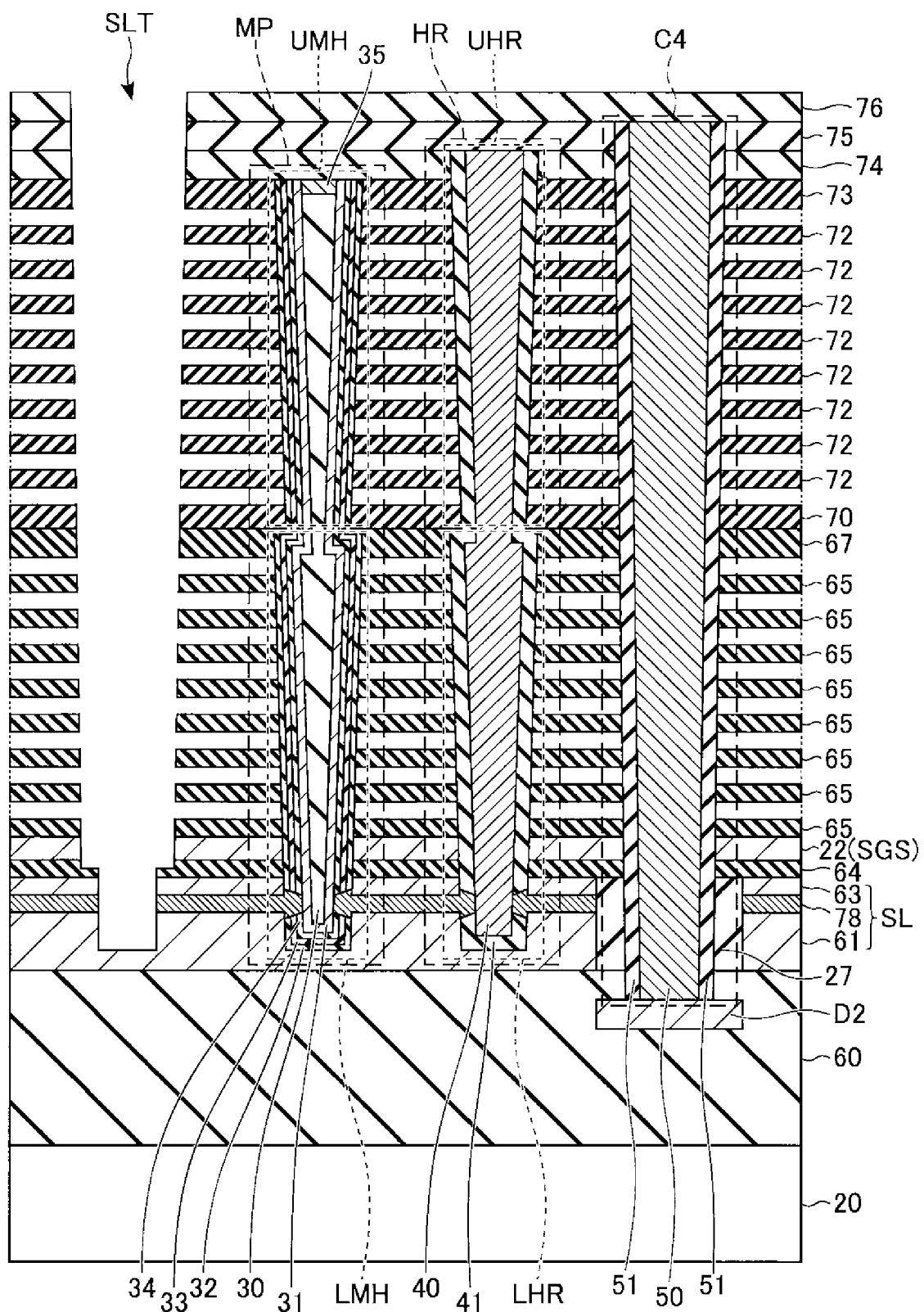
F I G. 26

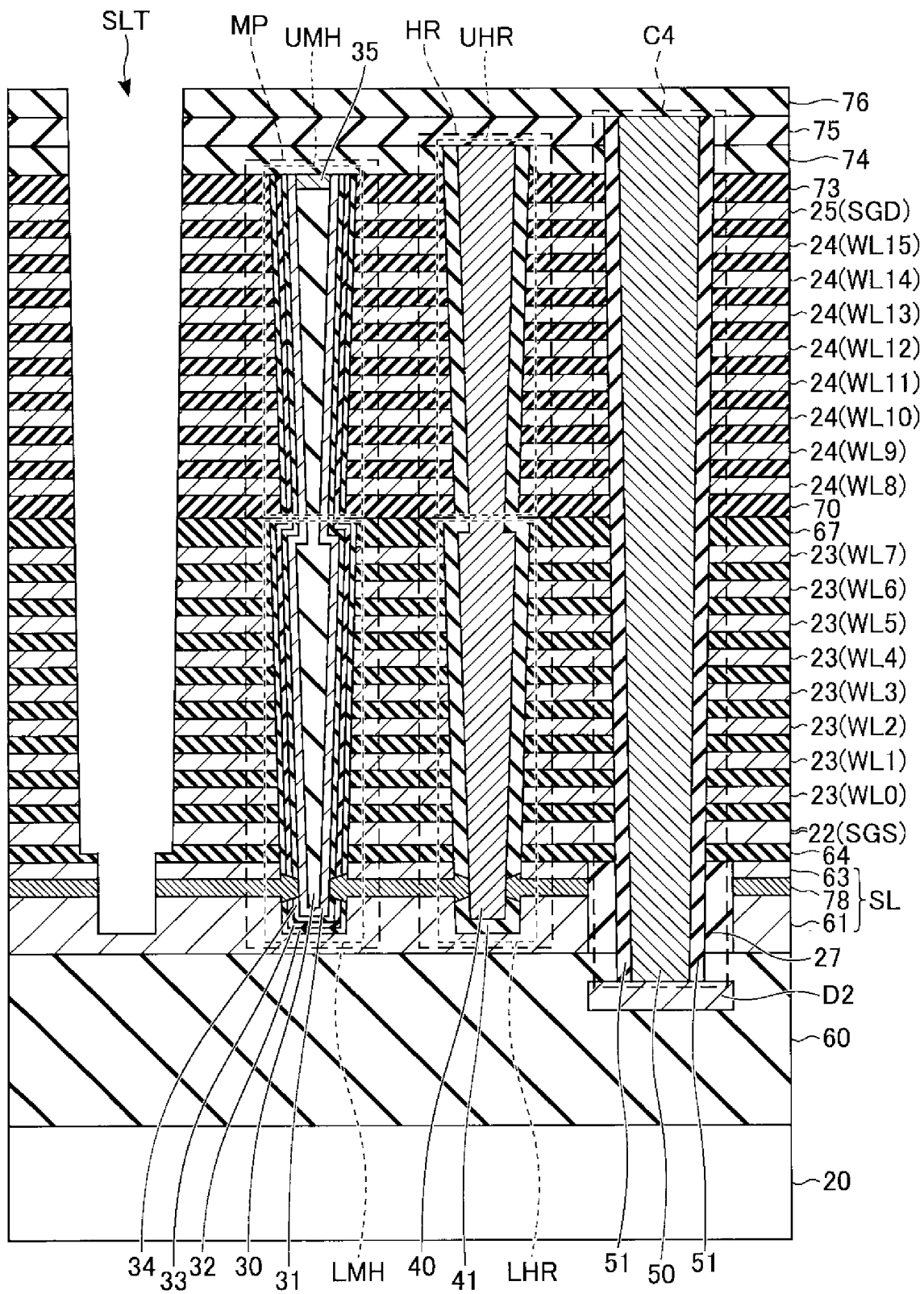
F I G. 27

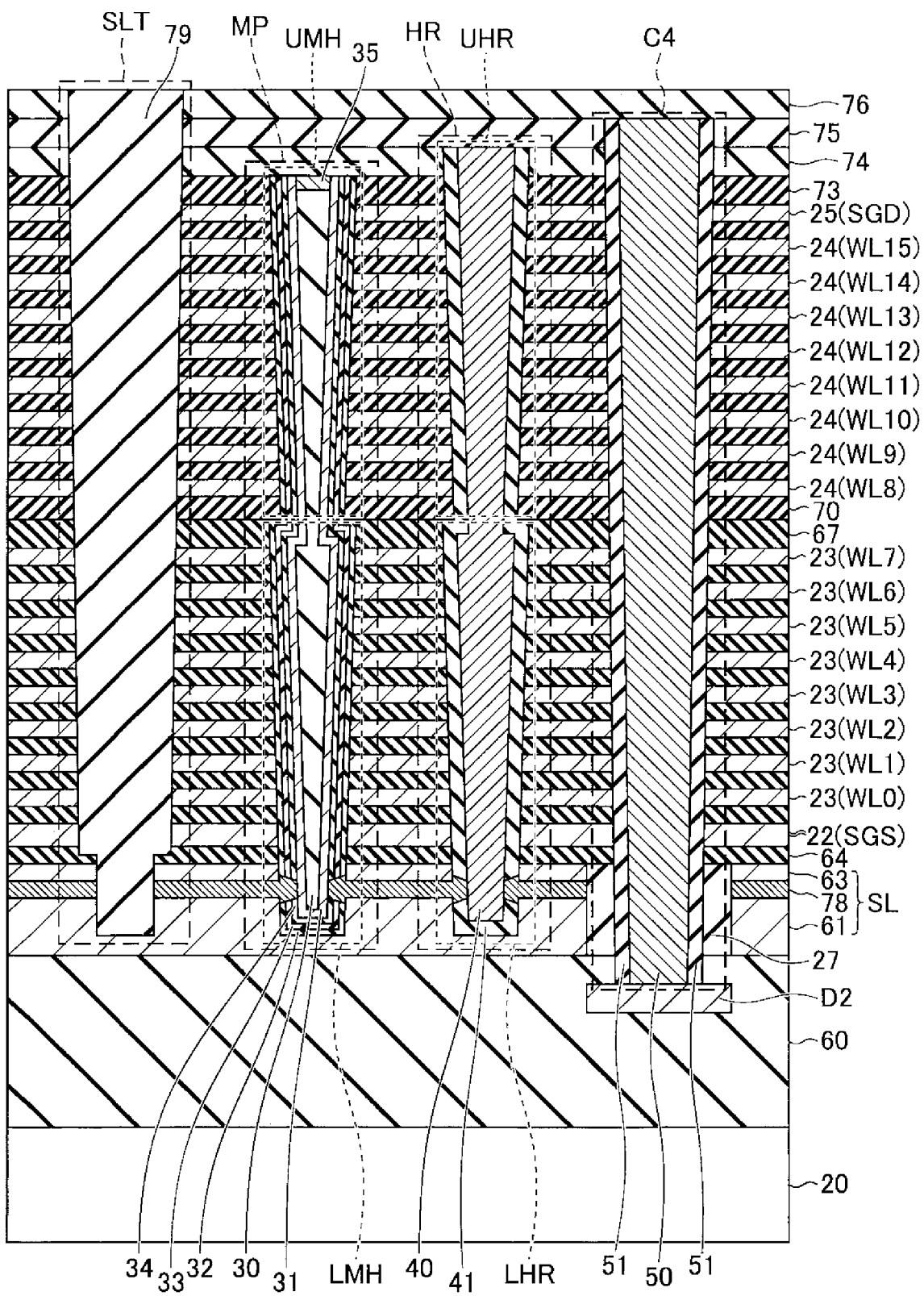
F I G. 28

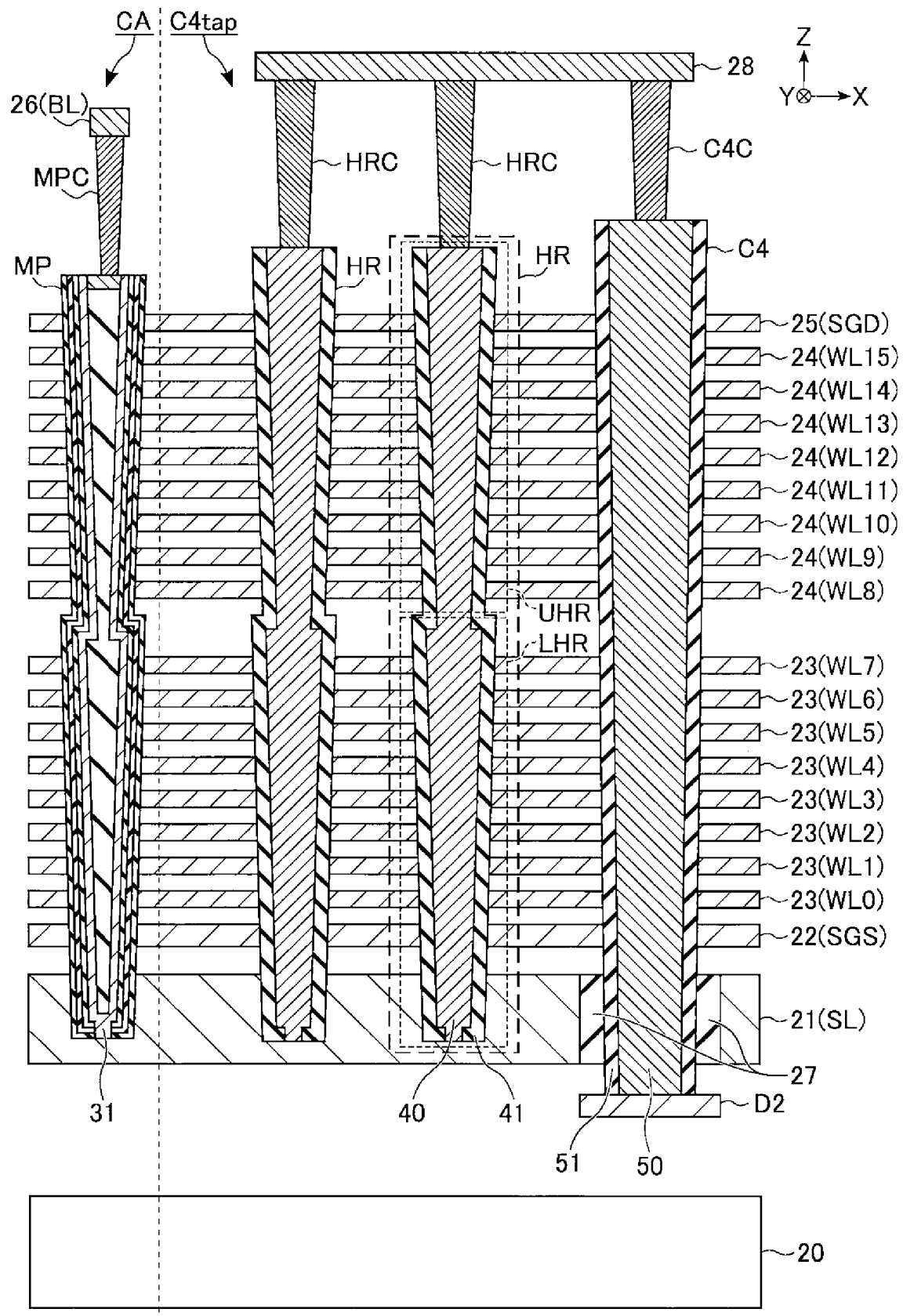
F I G. 29

SEMICONDUCTOR MEMORY DEVICE WITH THREE-DIMENSIONALLY STACKED MEMORY CELLS HAVING IMPROVED YIELD

CROSS-REFERENCE TO RELATED APPLICATIONS

This application is a continuation of U.S. application Ser. No. 16/567,153 filed Sep. 11, 2019, and is based upon and claims the benefit of priority from Japanese Patent Application No. 2019-051563, filed Mar. 19, 2019, the entire contents of each of which are incorporated herein by reference.

FIELD

Embodiments described herein relate generally to a semiconductor memory device.

BACKGROUND

A NAND-type flash memory capable of storing data in a non-volatile manner is known.

BRIEF DESCRIPTION OF THE DRAWINGS

FIG. 2 is a circuit diagram showing an example of a circuit configuration of a memory cell array of the semiconductor memory device according to the embodiment;

FIG. 3 is a plane view showing an example of a planar layout of the memory cell array of the semiconductor memory device according to the embodiment;

FIG. 4 is a plane view showing an example of a detailed planar layout of the memory cell array in a cell area of the semiconductor memory device according to the embodiment;

FIG. 5 is a cross-sectional view, taken along line V-V of FIG. 4, showing an example of a cross-section structure of the memory cell array in the cell area of the semiconductor memory device according to the embodiment;

FIG. 8 is a cross-sectional view, taken along line VIII-VIII of FIG. 7, showing an example of the cross-section structure in the cell area and the contact area of the semiconductor memory device according to the embodiment;

FIG. 13 is a cross-sectional view of the memory cell array showing an example of the process for manufacturing the semiconductor memory device according to the embodiment;

FIG. 14 is a cross-sectional view of the memory cell array showing an example of the process for manufacturing the semiconductor memory device according to the embodiment;

FIG. 15 is a cross-sectional view of the memory cell array showing an example of the process for manufacturing the semiconductor memory device according to the embodiment;

FIG. 16 is a cross-sectional view of the memory cell array showing an example of the process for manufacturing the semiconductor memory device according to the embodiment;

FIG. 18 is a cross-sectional view of the memory cell array showing an example of the process for manufacturing the semiconductor memory device according to the embodiment;

FIG. 20 is a cross-sectional view of the memory cell array showing an example of the process for manufacturing the semiconductor memory device according to the embodiment;

FIG. 24 is a cross-sectional view of the memory cell array showing an example of the process for manufacturing the semiconductor memory device according to the embodiment;

FIG. 26 is a cross-sectional view of the memory cell array showing an example of the process for manufacturing the semiconductor memory device according to the embodiment;

FIG. 27 is a cross-sectional view of the memory cell array showing an example of the process for manufacturing the semiconductor memory device according to the embodiment;

FIG. 28 is a cross-sectional view of the memory cell array showing an example of the process for manufacturing the semiconductor memory device according to the embodiment;

FIG. 29 is a cross-sectional view showing an example of a cross-sectional structure in a cell area and a contact area of a semiconductor memory device according to a first modification of the embodiment.

DETAILED DESCRIPTION

Figure 1:
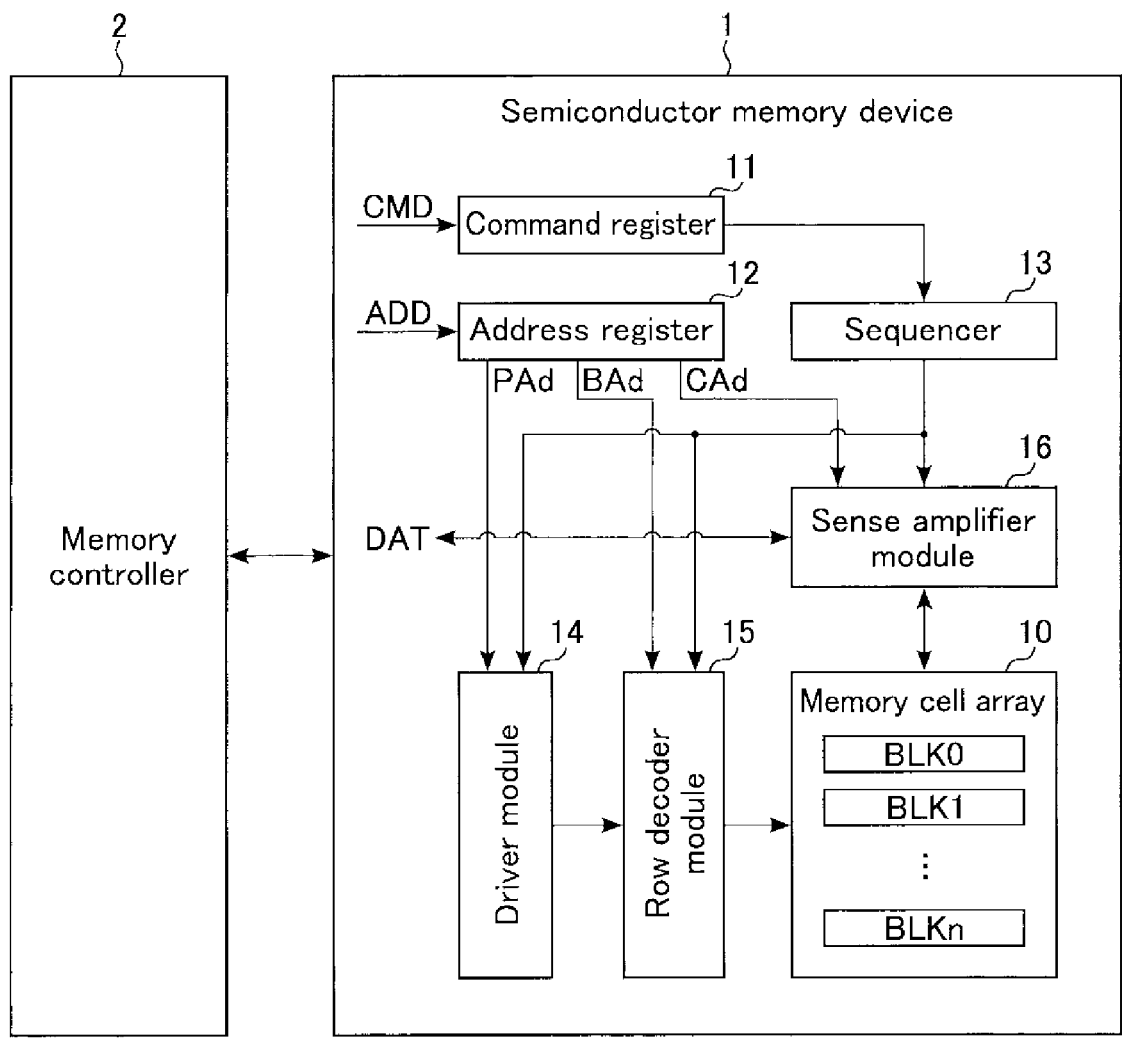
FIG. 1 is a block diagram showing a configuration example of a semiconductor memory device according to an embodiment.

In general, according to one embodiment, a semiconductor memory device includes a first conductor layer, a plurality of second conductor layers, a first pillar, a first contact, and a source line drive circuit. The first conductor layer is provided via a first insulator layer above a substrate. The second conductor layers are stacked above the first conductor layer and apart from each other in a first direction. The first pillar is passing through the second conductor layers along the first direction. The first pillar includes a first semiconductor layer and a second insulator layer. The first semiconductor layer includes a side surface partially in contact with the first conductor layer. The second insulator layer is provided between the first semiconductor layer and the second conductor layers. An intersections with the second conductor layers function as memory cell transistors. The first contact is passing through the second conductor layers along the first direction. The first contact includes a third conductor layer and a third insulator layer. The third conductor layer includes a side surface partially in contact with the first conductor layer. The third insulator layer is provided between the third conductor layer and the second conductor layers. The source line drive circuit is electrically coupled to the first conductor layer via the first contact.

Hereinafter, embodiments will be described with reference to the accompanying drawings. Each of the embodiments is an example of a device and a method to embody a technical idea of the invention. The drawings are schematic or conceptual, and the dimensions and ratios, etc. in the drawings are not always the same as the actual ones. Furthermore, the technical concept of the invention is not limited by the form, structure, arrangement or the like of the structural components.

In the description that follows, components having substantially the same functions and configurations will be denoted by the same reference symbols. The numbers after the letters constituting the reference symbols are used to discriminate between components that are denoted by the reference symbols sharing letters in common and that have similar configurations. If there is no need to discriminate between components that are denoted by the reference symbols sharing letters in common, such components are denoted by reference symbols that include the letters only.

Embodiment

Hereinafter, a semiconductor memory device 1 according to an embodiment will be described.

[1] Configuration of Semiconductor Memory Device 1

[1-1] Overall Configuration of Semiconductor Memory Device 1

FIG. 1 shows a configuration example of the semiconductor memory device 1 according to the embodiment. The semiconductor memory device 1 is a NAND-type flash memory which can store data in a non-volatile manner, and is controlled by an external memory controller 2. Communications between the semiconductor memory device 1 and the memory controller 2 support the NAND interface standard, for example.

As shown in FIG. 1, the semiconductor memory device 1 includes, for example, a memory cell array 10, a command register 11, an address register 12, a sequencer 13, a driver module 14, a row decoder module 15, and a sense amplifier module 16.

The memory cell array 10 includes a plurality of blocks BLK0 to BLKn (n is an integer greater than or equal to 1). A block BLK is a group of memory cells capable of storing data in a nonvolatile manner, and is, for example, a unit of erasing data. The memory cell array 10 is provided with a plurality of bit lines and word lines. Each memory cell is, for example, associated with one bit line and one word line. The memory cell array 10 will be described in detail later.

The command register 11 retains a command CMD received by the semiconductor memory device 1 from the memory controller 2. The command CMD includes instructions to cause the sequencer 13 to execute, for example, a read operation, a write operation, an erase operation, etc.

The address register 12 retains address information ADD received by the semiconductor memory device 1 from the memory controller 2. The address information ADD includes, for example, a block address BAd, a page address PAd, and a column address CAd. For example, the block address BAd, the page address PAd, and the column address CAd are used to select a block BLK, a word line, and a bit line, respectively.

The sequencer 13 controls the operation of the entire semiconductor memory device 1. For example, the sequencer 13 controls the driver module 14, the row decoder module 15, the sense amplifier module 16, etc., based on the command CMD held in the command register 11, and executes a read operation, a write operation, an erase operation, etc.

The driver module 14 generates voltages used for a read operation, a write operation, an erase operation, etc. The driver module 14 applies the generated voltage to a signal line corresponding to the selected word line based on, for example, the page address PAd held in the address register 12. Furthermore, the driver module 14 may apply the voltage to the source line SL. Namely, the driver module 14 is also a circuit that drives the source line SL.

The row decoder module 15 selects one block BLK in the corresponding memory cell array 10 based on a block address BAd held in the address register 12. The row decoder module 15 transfers, for example, the voltage applied to the signal line corresponding to the selected word line, to the selected word line in the selected block BLK.

In a write operation, the sense amplifier module 16 applies a desired voltage to each bit line in accordance with write data DAT received from the memory controller 2. Namely, the sense amplifier module 16 is also a circuit that drives the bit line BL. In a read operation, the sense amplifier module 16 determines the data stored in a memory cell based on the voltage of the bit line, and transfers the determination result as read data DAT to the memory controller 2.

The above mentioned semiconductor memory device 1 and memory controller 2 may be combined into a single semiconductor memory device. Such a semiconductor device may be a memory card, such as an SD™ card, and a solid state drive (SSD), for example.

[1-2] Circuit Configuration of Memory Cell Array 10

FIG. 2 shows an example of the circuit configuration of the memory cell array 10 included in the semiconductor memory device 1 according to the embodiment, focusing on one block BLK among a plurality of blocks BLK included in the memory cell array 10. As shown in FIG. 2, the block BLK includes, for example, four string units SU0 to SU3.

Each string unit SU includes a plurality of NAND strings NS that are respectively associated with bit lines BL0 to BLm (m is an integer greater than or equal to 1). Each NAND string NS includes, for example, memory cell transistors MT0 to MT15, and select transistors ST1 and ST2. Each memory cell transistor MT includes a control gate and a charge storage layer, and stores data in a non-volatile manner. Each of the select transistors ST1 and ST2 is used to select a string unit SU at the time of performing various operations.

In each NAND string NS, the memory cell transistors MT0 to MT15 are coupled in series. The select transistor ST1 includes a drain coupled to the associated bit line BL, and a source coupled to one end of each of the memory cell transistors MT0 to MT15 coupled in series. The select transistor ST2 includes a drain coupled to the other end of each of the memory cell transistors MT0 to MT15 coupled in series. The select transistor ST2 includes a source coupled to the source line SL.

In the same block BLK, control gates of the memory cell transistors MT0 to MT15 are coupled in common to respective word lines WL0 to WL15. In the string units SU0 to SU3, the gates of the select transistors ST1 are coupled in common to respective select gate lines SGD0 to SGD3. The gates of the select transistors ST2 are coupled in common to select gate line SGS.

In the above-described circuit configuration of the memory cell array 10, the word lines WL0 to WL7 intersect with a portion formed in a memory hole LMH described later, while the word lines WL8 to WL15 intersect with a portion formed in a memory hole UMH described later. The bit line BL is shared by the NAND string NS to which the same column address is assigned in each string unit SU. The source line SL is shared by a plurality of blocks BLK, for example.

A group of memory cell transistors MT coupled to a common word line WL in a string unit SU is referred to as, for example, a cell unit CU. For example, the storage capacity of the cell unit CU including the memory cell transistors MT each holding 1-bit data is defined as "1-page data". The cell unit CU may have a storage capacity of data of two or more pages in accordance with the number of bits of data stored in the memory cell transistor MT.

The circuit configuration of the memory cell array 10 included in the semiconductor memory device 1 according to the embodiment is not limited to the above described configuration. For example, the number of memory cell transistors MT and select transistors ST1 and ST2 included in each NAND string NS may be determined as appropriate. The number of string units SU included in each block BLK may be determined as appropriate.

[1-3] Configuration of Memory Cell Array 10

An example of the configuration of the memory cell array 10 according to the embodiment will be described.

In the drawings referred to in the following description, the X direction corresponds to the extending direction of word lines WL, the Y direction corresponds to the extending direction of bit lines BL, and the Z direction corresponds to the direction vertical to the surface of the semiconductor substrate 20 on which the semiconductor memory device 1 is formed. In the plan view, shading lines are provided as appropriate for viewability. The shading lines provided in the plan view are not necessarily related to materials or characteristics of elements with the shading lines. In the cross-sectional view, elements such as an insulation film (interlayer insulation film), an interconnect, a contact, etc. are omitted as appropriate for viewability.

FIG. 3 is an example of the planar layout of the memory cell array 10 included in the semiconductor memory device 1 according to the embodiment, focusing on a region including a structure corresponding to one block BLK (i.e., string units SU0 to SU3). As shown in FIG. 3, the memory cell array 10 includes a plurality of slits SLT.

The slits SLT each extend in the X direction and are arranged in the Y direction. The slits SLT include insulators to, for example, divide the interconnect layers corresponding to the word lines WL, the interconnect layer corresponding to the select gate line SGD, and the interconnect layer corresponding to the select gate line SGS. In this example, a region divided by the slits SLT corresponds to one string unit SU. That is, the string units SU0 to SU3 each extending in the X direction are arranged in the Y direction. In the memory cell array 10, the layout shown in FIG. 3, for example, is repeatedly arranged in the Y direction.

In the planar layout of the memory cell array 10 described above, a cell area CA and a contact area C4*tap* are arranged to extend in the Y direction. For example, the cell area CA and the contact area C4*tap* are alternately arranged in the X direction. The cell area CA is an area where the NAND string NS is formed. The contact area C4*tap* is an area where a contact is formed for electrically coupling the source line SL coupled to the NAND string NS and the circuit formed between the semiconductor substrate and the memory cell array 10. The cell area CA and the contact area C4*tap* of the memory cell array 10 will be described below in this order.

(Configuration in Cell Area CA)

FIG. 4 shows an example of a detailed planar layout of the memory cell array 10 in the cell area CA of the semiconductor memory device 1 according to the embodiment. As shown in FIG. 4, in the cell area CA, the memory cell array 10 includes a plurality of memory pillars MP and a plurality of bit lines BL.

The memory pillars MP are, for example, staggered in four lines in a region between neighboring slits SLT. The number or the arrangement of the memory pillars MP between the neighboring slits SLT is not limited to this, and may be changed as appropriate. Each of the memory pillars MP functions as one NAND string NS, for example.

The bit lines BL each extend in the Y direction, and are arranged in the X direction. Each bit line BL is arranged to overlap with at least one memory pillar MP in each string unit SU. In this example, each memory pillar MP overlaps with two bit lines BL. A contact MPC is provided between the memory pillar MP and one bit line BL of the plurality of bit lines BL overlapping with the memory pillar MP. Each memory pillar MP is electrically coupled to the corresponding bit line BL via the contact MPC.

FIG. 5 is a cross-sectional view taken along line V-V of FIG. 4, and shows an example of a cross-section structure in the cell area CA of the memory cell array 10 included in the semiconductor memory device 1 according to the embodiment. As shown in FIG. 5, the memory cell array 10 further includes conductor layers 21 to 26. The conductor layers 21 to 26 are provided above the semiconductor substrate 20.

Specifically, the conductor layer 21 is provided via an insulator layer above the semiconductor substrate 20. Although illustration is omitted, the insulator layer between the semiconductor substrate 20 and the conductor layer 21 is provided with a circuit such as a sense amplifier module 16. The conductor layer 21 is formed in a plate-like shape expanding along the XY plane, for example, and is used as the source line SL. The conductor layer 21 contains, for example, silicon (Si).

The conductor layer 22 is provided via the insulator layer above the conductor layer 21. The conductor layer 22 is formed in a plate-like shape expanding along the XY plane, for example, and is used as the select gate line SGS. The conductor layer 22 contains, for example, silicon (Si).

The insulator layer and the conductor layer 23 are alternately arranged above the conductor layer 22. The conductor layer 23 is formed in a plate-like shape expanding along the XY plane, for example. For example, the stacked conductor layers 23 are respectively used as the word lines WL0 to WL7 in the order from the semiconductor substrate 20 side. The conductor layer 23 contains, for example, tungsten (W).

The insulator layer and the conductor layer 24 are alternately arranged above the uppermost conductor layer 23. The conductor layer 24 is formed, for example, in a plate-like shape expanding along the XY plane. For example, the stacked conductor layers 24 are respectively used as word lines WL8 to WL15 in the order from the semiconductor substrate 20 side. The conductor layer 24 contains, for example, tungsten.

The insulator layer between the uppermost conductor layer 23 and the lowermost conductor layer 24 is thicker than that between the adjacent conductor layers 23, and thicker than that between the adjacent conductor layers 24. In other words, the space in the Z direction between the uppermost conductor layer 23 and the lowermost conductor layer 24 is larger than that in the Z direction between the adjacent conductor layers 23, and larger than that in the Z direction between the adjacent conductor layers 24.

The conductor layer 25 is provided via the insulator layer above the uppermost conductor layer 24. The conductor layer 25 is formed in a plate-like shape expanding along the XY plane, for example, and is used as the select gate line SGD. The conductor layer 25 contains, for example, tungsten.

The conductor layer 26 is provided via the insulator layer above the conductor layer 25. The conductor layer 26 is formed in a shape of a line extending along the Y direction, for example, and is used as the bit line BL. Namely, a plurality of conductor layers 26 are arranged along the X direction in a region not shown. The conductor layer 26 contains, for example, copper (Cu).

The memory pillar MP is provided to extend along the Z direction, and passes through the conductor layers 22 to 25. Each memory pillar MP includes a first portion formed in a lower memory hole LMH, and a second portion formed in an upper memory hole UMH.

Specifically, the first portion corresponding to the memory hole LMH passes through the conductor layers 22 and 23. The first portion corresponding to the memory hole LMH includes a bottom that is located inside the layer in which the conductor layer 21 is provided. In other words, the bottom of the first portion corresponding to the memory hole LMH is terminated without passing through the conductor layer 21. The second portion corresponding to the memory hole UMH is provided above the first portion corresponding to the memory hole LMH, and passes through the conductor layers 24 and 25.

The memory pillar MP includes, for example, a core member 30, a semiconductor layer 31, a tunnel insulation film 32, an insulation film 33, a block insulation film 34, and a semiconductor portion 35. The core member 30, the semiconductor layer 31, the tunnel insulation film 32, the insulation film 33, and the block insulation film 34 are continuously provided between the first portion and the second portion of the memory pillar MP.

Specifically, the core member 30 is provided to extend along the Z direction. For example, the upper end of the core member 30 is included in the layer higher than the layer in which the conductor layer 25 is provided, while the lower end of the core member 30 is included in the layer in which the conductor layer 21 is provided. The core member 30 includes an insulator of silicon oxide ($SiO_2$), etc.

The semiconductor layer 31 covers the side and bottom surfaces of the core member 30. The semiconductor layer 31 includes a side contact portion SC1. The side contact portion SC1 is included in the layer in which the conductor layer 21 is provided. At the side contact portion SC1, the semiconductor layer 31 is in contact with the conductor layer 21, and electrically coupled to the conductor layer 21. The semiconductor layer 31 contains, for example, silicon.

The tunnel insulation film 32 covers the side and bottom surfaces of the semiconductor layer 31 except for the side contact portion SC1. The insulation film 33 covers the side and bottom surfaces of the tunnel insulation film 32 except for the side contact portion SC1. The block insulation film 34 covers the side and bottom surfaces of the insulation film 33 except for the side contact portion SC1. The tunnel insulation film 32 and the block insulation film 34 each contain, for example, silicon oxide. The insulation film 33 contains, for example, silicon nitride (SiN).

The semiconductor portion 35 is included in the layer higher than the conductor layer 25, and the side surface is in contact with the inner wall of the semiconductor layer 31 while the bottom surface is in contact with the core member 30, for example. The semiconductor portion 35 and the semiconductor layer 31 are electrically coupled. The semiconductor portion 35 is, for example, formed of a material similar to that of the semiconductor layer 31.

A column-like contact MPC is provided on the top surfaces of the semiconductor layer 31 and the semiconductor portion 35 in the memory pillar MP. In the region illustrated, the contact MPC of one memory pillar MP out of two memory pillars MP is shown. To the memory pillar MP to which the contact MPC is not coupled in this region, a contact MPC is coupled in a region not shown. One conductor layer 26, i.e., one bit line BL, is in contact with the top surface of the contact MPC. One contact MPC is coupled to one bit line BL in the space partitioned by the slits SLT.

The slit SLT is formed in a plate-like shape expanding along the XZ plane, for example, and divides the conductor layers 22 to 25. The upper end of the slit SLT is included in the layer between the conductor layers 25 and 26. The lower end of the slit SLT is included in the layer in which the conductor layer 21 is provided, for example. The slit SLT includes an insulator of silicon oxide, for example.

Figure 6:
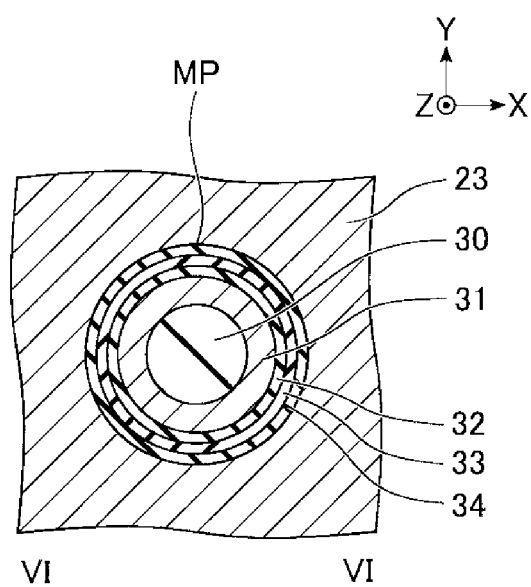
FIG. 6 is a cross-sectional view, taken along line VI-VI of FIG. 5, showing an example of a cross-section structure of a memory pillar in the cell area of the semiconductor memory device according to the embodiment.

FIG. 6 is a cross-sectional view taken along line VI-VI of FIG. 5, and shows an example of the cross-section structure of the memory pillar MP in the semiconductor memory device according to the embodiment. More specifically, FIG. 6 shows the cross-section structure of the memory pillar MP and its peripheral portion in the layer parallel to the surface of the semiconductor substrate 20 and including the conductor layer 23.

As shown in FIG. 6, in the layer including the conductor layer 23, the core member 30 is provided at the center of the memory pillar MP, for example. The semiconductor layer 31 surrounds the side surface of the core member 30. The tunnel insulation film 32 surrounds the side surface of the semiconductor layer 31. The insulation film 33 surrounds the side surface of the tunnel insulation film 32. The block insulation film 34 surrounds the side surface of the insulation film 33. The conductor layer 23 surrounds the side surface of the block insulation film 34.

In the above-described structure of the memory pillar MP, the portion where the memory pillar MP and the conductor layer 22 intersect with each other functions as the select transistor ST2. The portion where the memory pillar MP and the conductor layer 23 intersect with each other and the portion where the memory pillar MP and the conductor layer 24 intersect with each other function as the memory cell transistors MT. The portion where the memory pillar MP and the conductor layer 25 intersect with each other functions as the select transistor ST1.

Namely, the semiconductor layer 31 is used as a channel of each of the memory cell transistors MT and the select transistors ST1 and ST2. The insulation film 33 is used as a charge storage layer in the memory cell transistor MT. Therefore, each of the memory pillars MP may function as one NAND string NS.

(Configuration in Contact Area C4*tap*)

Figure 7:
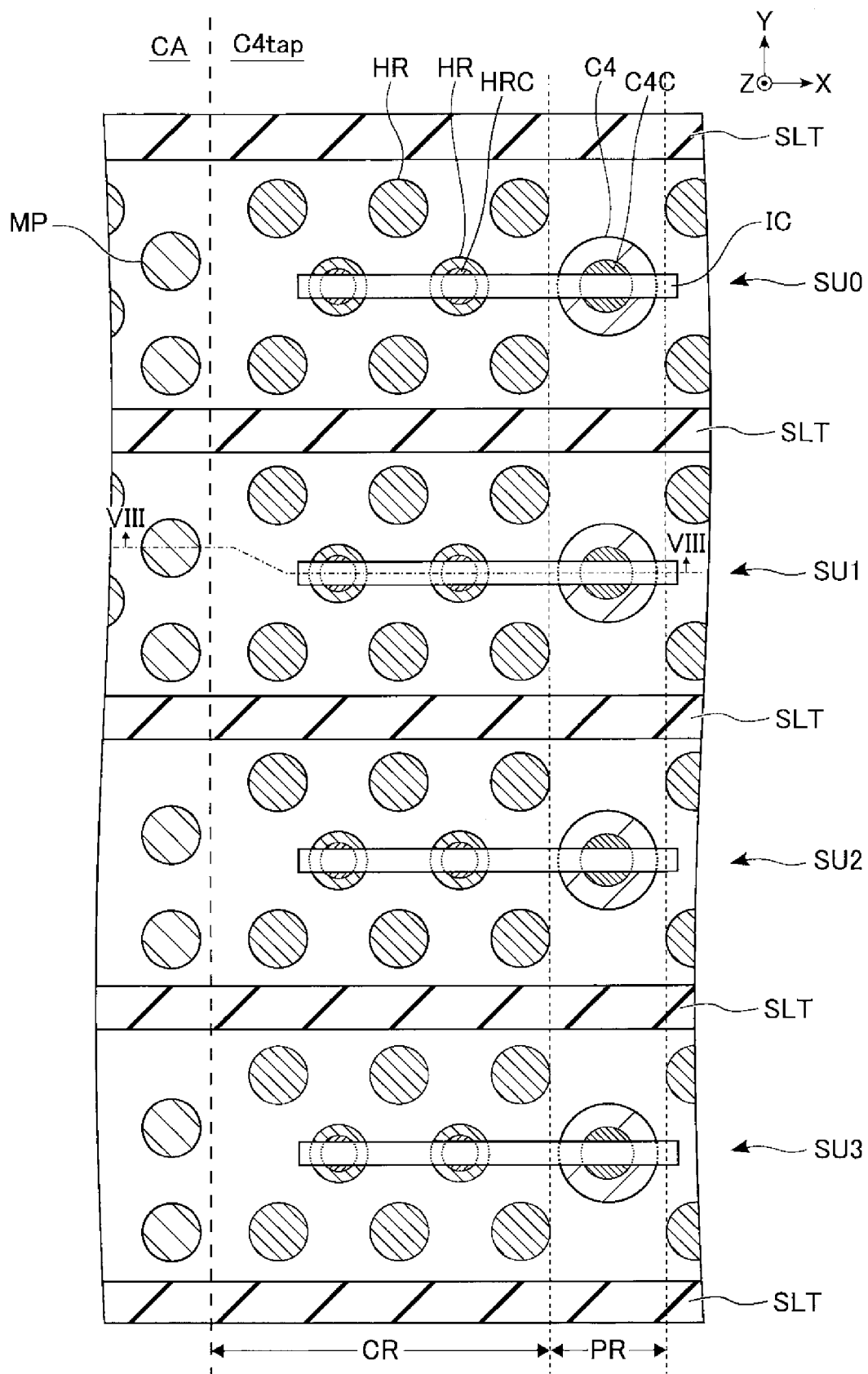
FIG. 7 is a plan view showing an example of a detailed planar layout in the cell area and a contact area of the semiconductor memory device according to the embodiment.

FIG. 7 shows an example of the detailed planar layout of the memory cell array 10 in the contact area C4*tap* of the semiconductor memory device 1 according to the embodiment. The region shown in FIG. 7 includes an end region of the cell area CA. As shown in FIG. 7, the memory cell array 10 includes, in the contact area C4*tap*, a plurality of support pillars HR, contacts C4, and interconnects IC.

In the contact area C4*tap*, regions CR and PR are provided to each extend in the Y direction. The region CR is provided to be adjacent to the cell area CA. The region PR is provided to be adjacent to the region CR and away from the cell area CA. The region CR includes a plurality of support pillars HR. The region PR includes a plurality of contacts C4. The support pillars HR may be included in the region PR.

Although illustration is omitted, the source line SL in the region CR and the source line SL in the cell area CA are continuously provided, and electrically coupled. In the region PR, the source line SL may or may not be divided. The source line SL in the region PR may be provided to have a different layer structure from the cell area CA and the region CR. The following description is based on the case where the source line SL is divided in the region PR.

Each of the support pillars HR includes a lower end that is electrically coupled to the source line SL. For example, the support pillars HR are arranged between the neighboring slits SLT in the region CR. Each of the contacts C4 includes a lower end that is electrically coupled to the interconnect below the memory cell array 10. For example, the contact C4 is arranged between the neighboring slits SLT in the region PR. The plurality of interconnects IC are arranged to overlap with at least two support pillars HR and at least one contact C4.

The plurality of support pillars HR include those overlapping with the interconnect IC and those not overlapping with the interconnect IC. A contact HRC is provided, as an upper contact, between the support pillar HR and the interconnect IC on the support pillar HR overlapping with the interconnect IC. An upper contact is not provided on the support pillar HR that does not overlap with the interconnect IC. The support pillar HR overlapping with the interconnect IC is electrically coupled to the corresponding interconnect IC via the contact HRC. A contact C4C is provided between the contact C4 and the interconnect IC overlapping with the contact C4. The contact C4 is electrically coupled to the corresponding interconnect IC via the contact C4C.

In the example of FIG. 7, in each string unit SU region, the interconnect IC is provided to overlap with two support pillars HR and one contact C4. The contacts HRC are provided to correspond to the two support pillars HR, and the contact C4C is provided to correspond to the contact C4. That is, two support pillars HR coupled in parallel to the source line SL and one contact C4 are electrically coupled via the interconnect IC.

The planar layout of the memory cell array 10 in the contact area C4*tap* can be modified in various manners, and is not limited to the example of FIG. 7. For example, the interconnect IC may be provided to overlap with three or more support pillars HR. The plurality of support pillars HR overlapping with the interconnect IC may include those provided with the contacts HRC and coupled to the interconnect IC, and those not provided with the contacts HRC and not coupled to the interconnect IC. The support pillar HR, the contact C4, and the interconnect IC do not have to be provided independently for each string unit SU.

FIG. 8 is a cross-sectional view taken along line VIII-VIII of FIG. 7, and shows an example of the cross-section structure in the contact area C4*tap* of the memory cell array 10 included in the semiconductor memory device 1 according to the embodiment. The region shown in FIG. 8 includes one memory pillar MP in the cell area CA. As shown in FIG. 8, the memory cell array 10 further includes a conductor layer D2, insulator layers 27, and a conductor layer 28, in the contact area C4*tap*.

The conductor layer D2 is, for example, an interconnect coupled to the driver module 14, and is provided between the semiconductor substrate 20 and the conductor layer 21. The insulator layers 27 divide the conductor layer 21 (source line SL), for example. The region where the insulator layers 27 is provided corresponds to the region PR. The insulator layers 27 do not necessarily have to be provided, and a conductor layer having a different structure from that of the conductor layer 21 may be provided in the region where the insulator layer 27 is provided. In this case, the conductor layer 21 (source line SL) in the neighboring cell area CA is electrically coupled via the conductor layer of a different structure. The conductor layer 28 is, for example, provided above the conductor layer 26, and used as an interconnect IC.

The support pillar HR is provided to extend along the Z direction, and passes through the conductor layers 22 to 25. The layer including the upper end of the support pillar HR is included in the layer higher than the layer including the upper end of the memory pillar MP. Each support pillar HR includes a first portion formed in a lower hole LHR, and a second portion formed in an upper hole UHR.

Specifically, the first portion corresponding to the hole LHR passes through the conductor layers 22 and 23. The first portion corresponding to the hole LHR includes a bottom that is located inside the layer in which the conductor layer 21 is provided. In other words, the bottom of the first portion corresponding to the hole LHR is terminated without passing through the conductor layer 21. The second portion corresponding to the hole UHR is provided above the first portion corresponding to the hole LHR, and passes through the conductor layers 24 and 25. The upper end of the first portion of the support pillar HR, i.e., the upper end of the first portion formed in the hole LHR, has a height nearly equal to that of the upper end of the first portion of the memory pillar MP, i.e., the upper end of the first portion formed in the memory hole LMH.

The support pillar HR includes, for example, a conductor layer 40 and an insulation film 41. For example, the conductor layer 40 and the insulation film 41 are continuously provided between the first and second portions of the support pillar HR.

Specifically, the conductor layer 40 is provided to extend along the Z direction. For example, the upper end of the conductor layer 40 is included in the layer higher than the upper end of the semiconductor layer 31 in the memory pillar MP, while the lower end of the conductor layer 40 is included in the layer in which the conductor layer 21 is provided. The conductor layer 40 is in contact with the conductor layer 21 at the side contact portion SC2 included in the layer in which the conductor layer 21 is provided, and is electrically coupled to the conductor layer 21. The conductor layer 40 may be a metal or a semiconductor. For example, the conductor layer 40 may contain tungsten or silicon.

The insulation film 41 covers the side and bottom surfaces of the conductor layer 40 except for the side contact portion SC2 of the conductor layer 40. The insulation film 41 contains, for example, silicon oxide.

A column-like contact HRC is provided on the support pillar HR coupled to the interconnect IC. Specifically, the contact HRC is provided on the conductor layer 40. In the region illustrated, the contact HRC is provided on the top surface of each of two support pillars HR, and one conductor layer 28 is in contact with the tops of the contacts HRC.

The contact C4 is provided to extend along the Z direction, and passes through the conductor layers 22 to 25 and the insulator layer 27. The upper end of the contact C4 is included in the layer higher than the upper end of the support pillar HR. The bottom of the contact C4 is in contact with the conductor layer D2. The contact C4 has an outer diameter larger than that of the support pillar HR.

The contact C4 includes, for example, a conductor layer 50 and an insulation film 51.

Specifically, the conductor layer 50 is provided to extend in the Z direction. For example, the upper end of the conductor layer 50 is included in the layer higher than the upper end of the conductor layer 40 in the support pillar HR, while the lower end of the conductor layer 50 is in contact with the conductor layer D2. The conductor layer 50 contains, for example, tungsten.

The insulation film 51 covers the side surface of the conductor layer 50. The insulation film 51 contains, for example, silicon oxide.

A column-like contact C4C is provided on the contact C4. The top surface of the contact C4C is in contact with the conductor layer 28.

Figure 9:
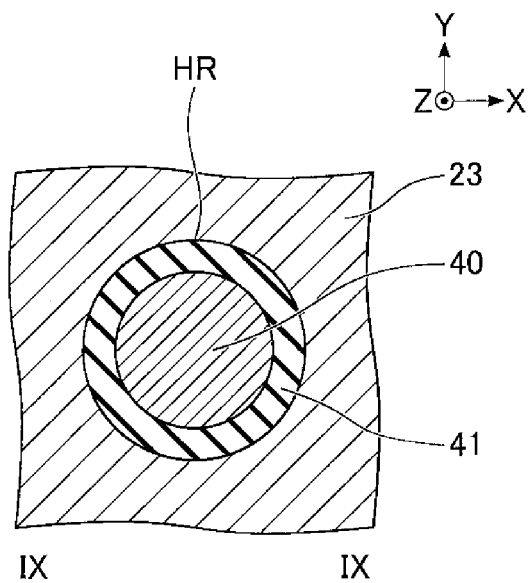
FIG. 9 is a cross-sectional view, taken along line IX-IX of FIG. 8, showing an example of a cross-section structure of a support pillar in the contact area of the semiconductor memory device according to the embodiment.

FIG. 9 is a cross-sectional view taken along line IX-IX of FIG. 8, and shows an example of the cross-section structure of the support pillar HR in the semiconductor memory device according to the embodiment. More specifically, FIG. 9 shows the cross-section structure of the support pillar HR and its peripheral portion in the layer parallel to the surface of the semiconductor substrate 20 and including the conductor layer 23.

As shown in FIG. 9, in the layer including the conductor layer 23, the conductor layer 40 is provided at the center of the support pillar HR, for example. The insulation film 41 surrounds the side surface of the conductor layer 40. The conductor layer 23 surrounds the side surface of the insulation film 41.

Figure 10:
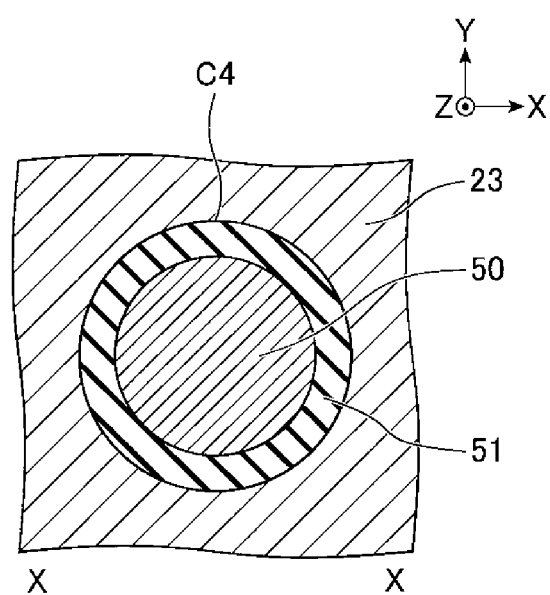
FIG. 10 is a cross-sectional view, taken along line X-X of FIG. 8, showing an example of a cross-section structure of a contact in the contact area of the semiconductor memory device according to the embodiment.

FIG. 10 is a cross-sectional view taken along line X-X of FIG. 8, and shows an example of the cross-section structure of the contact C4 in the semiconductor memory device according to the embodiment. More specifically, FIG. 10 shows the cross-section structure of the contact C4 and its peripheral portion in the layer parallel to the surface of the semiconductor substrate 20 and including the conductor layer 23.

As shown in FIG. 10, in the layer including the conductor layer 23, the conductor layer 50 is provided at the center of the contact C4, for example. The insulation film 51 surrounds the side surface of the conductor layer 50. The conductor layer 23 surrounds the side surface of the insulation film 51.

In the above-described structure of the support pillar HR and the contact C4, the conductor layers 40 and 50 function as a current path between the source line SL and the conductor layer D2. Namely, the conductor layer 21 used as the source line SL is electrically coupled to the conductor layer D2 via the conductor layer 40, the contact HRC, the interconnect IC, the contact C4C, and the conductor layer 50.

The configuration of the memory cell array 10 has been described as an example above, and the memory cell array 10 may have other configurations. For example, the number of the conductor layers 23 or the conductor layers 24 is determined based on the number of word lines WL. A plurality of conductor layers 22 provided in a plurality of layers may be allocated to the select gate line SGS. If the select gate line SGS is provided in a plurality of layers, a conductor layer different from the conductor layer 22 may be used. A plurality of conductor layers 25 provided in a plurality of layers may be allocated to the select gate line SGD.

The memory pillar MP and the conductor layer 26 may be electrically coupled via two or more contacts, and may be electrically coupled via other interconnect. Similarly, the support pillar HR and the interconnect IC, and the contact C4 and the interconnect IC, may be electrically coupled via two or more contacts, or other interconnect. The inside of the slit SLT may be made of various types of insulators. For example, silicon nitride (SiN) may be formed as a side wall of the slit SLT before silicon oxide is filled in the slit SLT.

[2] Manufacturing Method of Semiconductor Memory Device 1

Next, a description will be given of an example of a series of manufacturing processes relating to formation of the stacked interconnect structure inside the memory cell array 10 in the semiconductor memory device 1 according to the embodiment. FIGS. 11 to 28 each show an example of the cross-section structure including the structure corresponding to the memory cell array 10 in the process of manufacturing the semiconductor memory device 1 according to the embodiment. The area shown in the cross-sectional view of each manufacturing process referred to in the following description includes a region where the memory pillar MP, the support pillar HR, the contact C4, and the slit SLT are formed.

Figure 11:
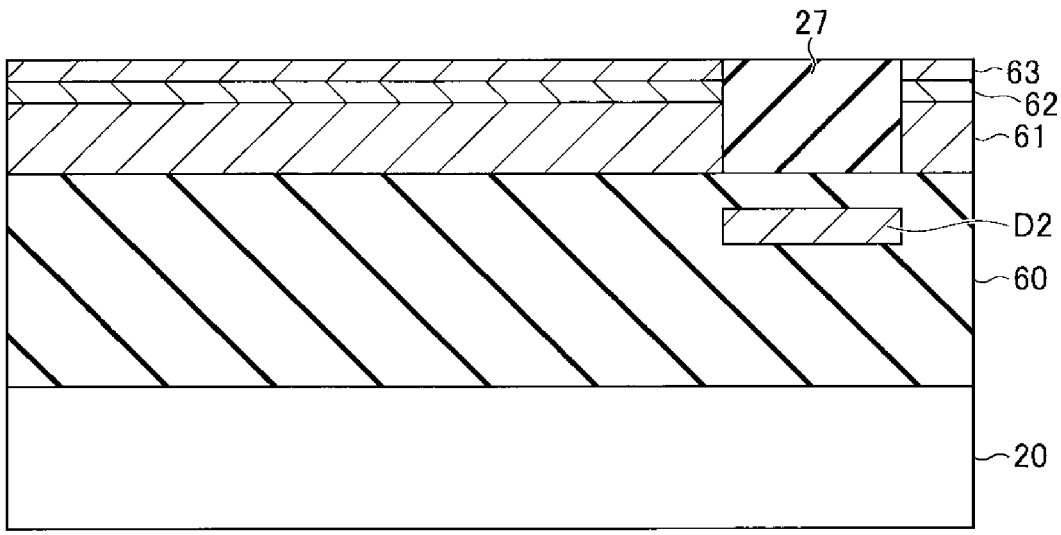
FIG. 11 is a cross-sectional view of the memory cell array showing an example of the process for manufacturing the semiconductor memory device according to the embodiment.

First, as shown in FIG. 11, a source line portion is formed. The source line portion refers to a stacked structure of the interconnect layer corresponding to the conductor layer 21 used as the source line SL. In this process, first, an insulator layer 60 including the conductor layer D2, a conductor layer 61, a sacrifice member 62, and a conductor layer 63 are formed in this order on the semiconductor substrate 20. Then, a part of each of the conductor layer 61, the sacrifice member 62 and the conductor layer 63 is removed, and the insulator layer 27 is formed in the space obtained by removal.

A part of the conductor layer D2 and the insulator layer 27 overlap with the region PR described with reference to FIG. 7. Although illustration is omitted, circuits corresponding to the driver module 14, the sense amplifier module 16, etc. are formed between the semiconductor substrate 20 and the conductor layer 61. The conductor layers 61 and 63 each contain, for example, polysilicon with phosphorus doped therein. For the sacrifice member 62, a material capable of increasing the etching selection ratio to each of the conductor layers 61 and 63 is selected. The insulator layer 27 contains, for example, silicon oxide ($SiO_2$).

Figure 12:
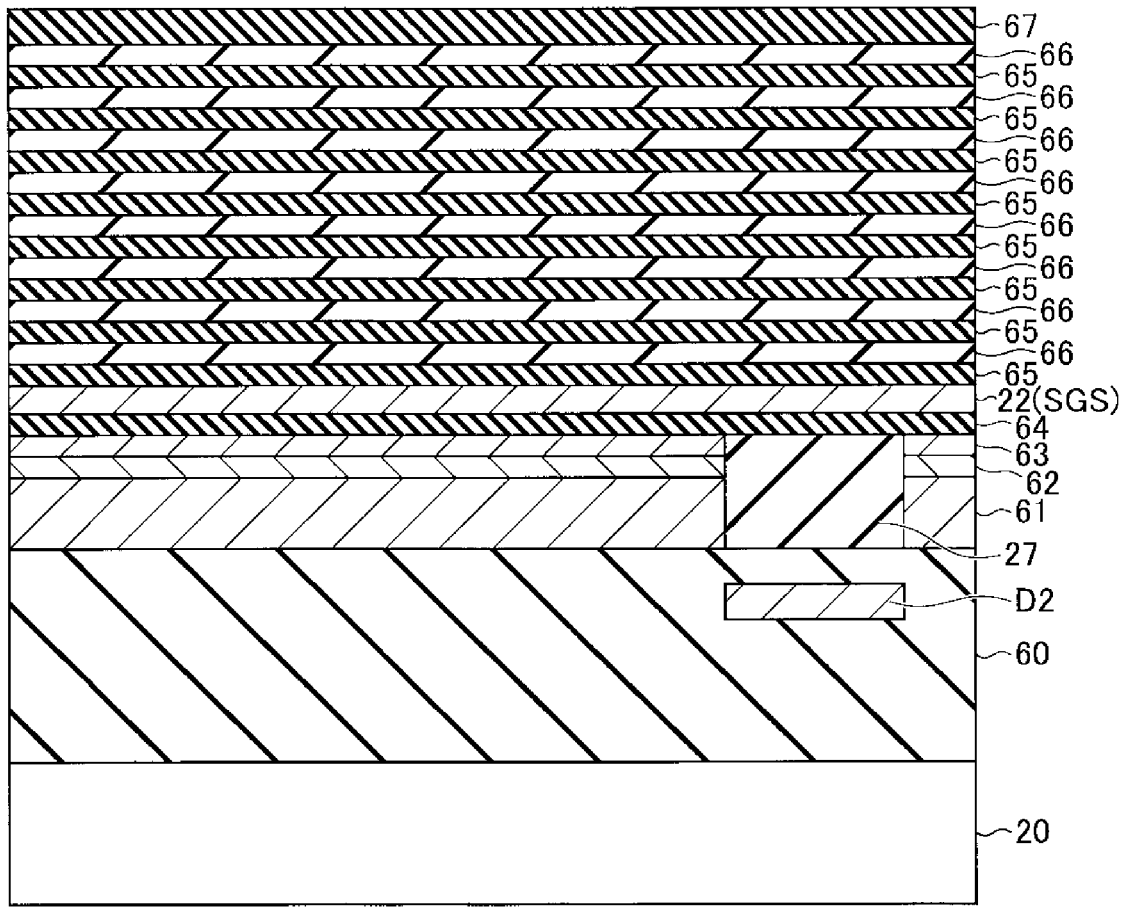
FIG. 12 is a cross-sectional view of the memory cell array showing an example of the process for manufacturing the semiconductor memory device according to the embodiment.

Next, as shown in FIG. 12, an insulator layer 64 is formed on the conductor layer 63 and the insulator layer 27. A conductor layer 22 is formed on the insulator layer 64. An insulator layer 65 and a sacrifice member 66 are alternatively arranged on the conductor layer 22. An insulator layer 67 is formed on the uppermost sacrifice member 66. The conductor layer 22 corresponds to the select gate line SGS. The insulator layers 64, 65, and 67 each contain silicon oxide, for example. The sacrifice member 66 corresponds to the word line WL intersecting with the first portion of the memory pillar MP. The sacrifice member 66 contains, for example, silicon nitride (SiN).

Next, as shown in FIG. 13, the memory hole LMH and the hole LHR are formed. Specifically, first, a mask is formed by photolithography, etc. in which areas corresponding to the memory hole LMH and the hole LHR are opened. Then, by anisotropic etching using the formed mask, the memory hole LMH and the hole LHR are formed.

The memory hole LMH and the hole LHR formed in this process pass through the insulator layers 64, 65 and 67, the sacrifice members 62 and 66, and the conductor layers 22 and 63, and the memory hole LMH and the hole LHR each include the bottom that is terminated inside the conductor layer 61. The anisotropic etching in this process is, for example, reactive ion etching (RIE).

Next, as shown in FIG. 14, the sacrifice member 68 is formed in each of the memory hole LMH and the hole LHR. Specifically, first, the sacrifice members 68 are formed to fill in the memory hole LMH and the hole LHR. Then, the sacrifice members 68 formed outside the memory hole LMH and the hole LHR are removed by, for example, chemical mechanical polishing (CMP). The sacrifice member 68 is, for example, amorphous silicon.

Next, as shown in FIG. 15, the insulator layer 70 is formed on the insulator layer 67 and the sacrifice members 68. The sacrifice member 71 and the insulator layer 72 are alternatively arranged on the insulator layer 70. The insulator layer 73 is formed on the uppermost sacrifice member 71. The insulator layers 70, 72, and 73 each contain, for example, silicon oxide. The sacrifice members 71 correspond to the word lines WL and the select gate line SGD intersecting with the second portion of the memory pillar MP. The sacrifice member 71 contains, for example, silicon nitride.

Next, as shown in FIG. 16, the memory hole UMH is formed. Specifically, first, a mask is formed by photolithography, etc., in which an area corresponding to the memory hole UMH, i.e., an area overlapping with the memory hole LMH, is opened. Then, by anisotropic etching using the formed mask, the memory hole UMH is formed.

The memory hole UMH formed in this process is provided on the sacrifice member 68 filled in the memory hole LMH. The memory hole UMH passes through the insulator layers 70, 72 and 73, and the sacrifice members 71, and at the bottom of the memory hole UMH, a part of the sacrifice member 68 in the memory hole LMH is exposed. The anisotropic etching in this process is, for example, RIE.

Figure 17:
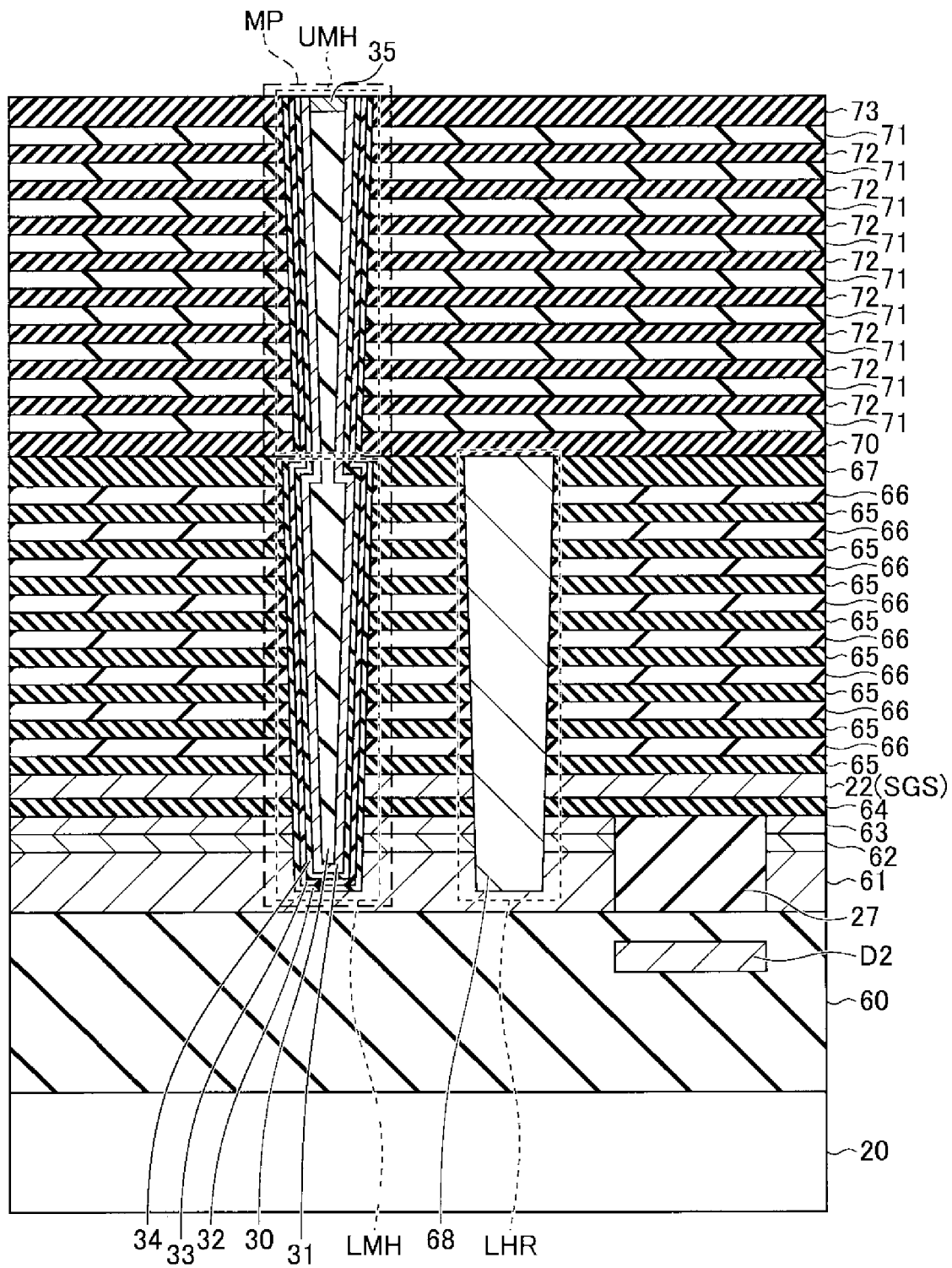
FIG. 17 is a cross-sectional view of the memory cell array showing an example of the process for manufacturing the semiconductor memory device according to the embodiment.

Next, as shown in FIG. 17, the memory pillars MP is formed. Specifically, first, the sacrifice member 68 formed in the memory hole LMH is removed by wet etching, etc. through the memory hole UMH. Next, the block insulation film 34, the insulation film 33, the tunnel insulation film 32, the semiconductor layer 31, and the core member 30 are formed in this order in the memory holes LMH and UMH. Then, the block insulation film 34, the insulation film 33, the tunnel insulation film 32, the semiconductor layer 31, and the core member 30 formed above the top surface of the insulator layer 73 are removed by, for example, CMP. Then, the upper end of the core member 30 is etched back up to the inside of the layer in which the insulator layer 73 is formed, thereby forming a semiconductor portion 35 in the area where the core member 30 is removed. As a result, the structure corresponding to the memory pillar MP is formed in each of the memory holes LMH and UMH.

Next, as shown in FIG. 18, the hole UHR is formed. Specifically, the insulator layer 74 is formed on the top surfaces of the insulator layer 73 and the memory pillar MP. Then, a mask is formed by photolithography, etc., in which an area corresponding to the hole UHR, i.e., an area overlapping with the hole LHR, is opened. Then, by anisotropic etching using the formed mask, the hole UHR is formed.

The hole UHR formed in this process is provided on the sacrifice member 68 filled in the hole LHR. The hole UHR passes through the insulator layers 70, 72, 73 and 74, and the sacrifice members 71, and at the bottom of the hole UHR, a part of the sacrifice member 68 in the hole LHR is exposed. The anisotropic etching in this process is, for example, RIE. The insulator layer 74 contains, for example, silicon oxide.

Figure 19:
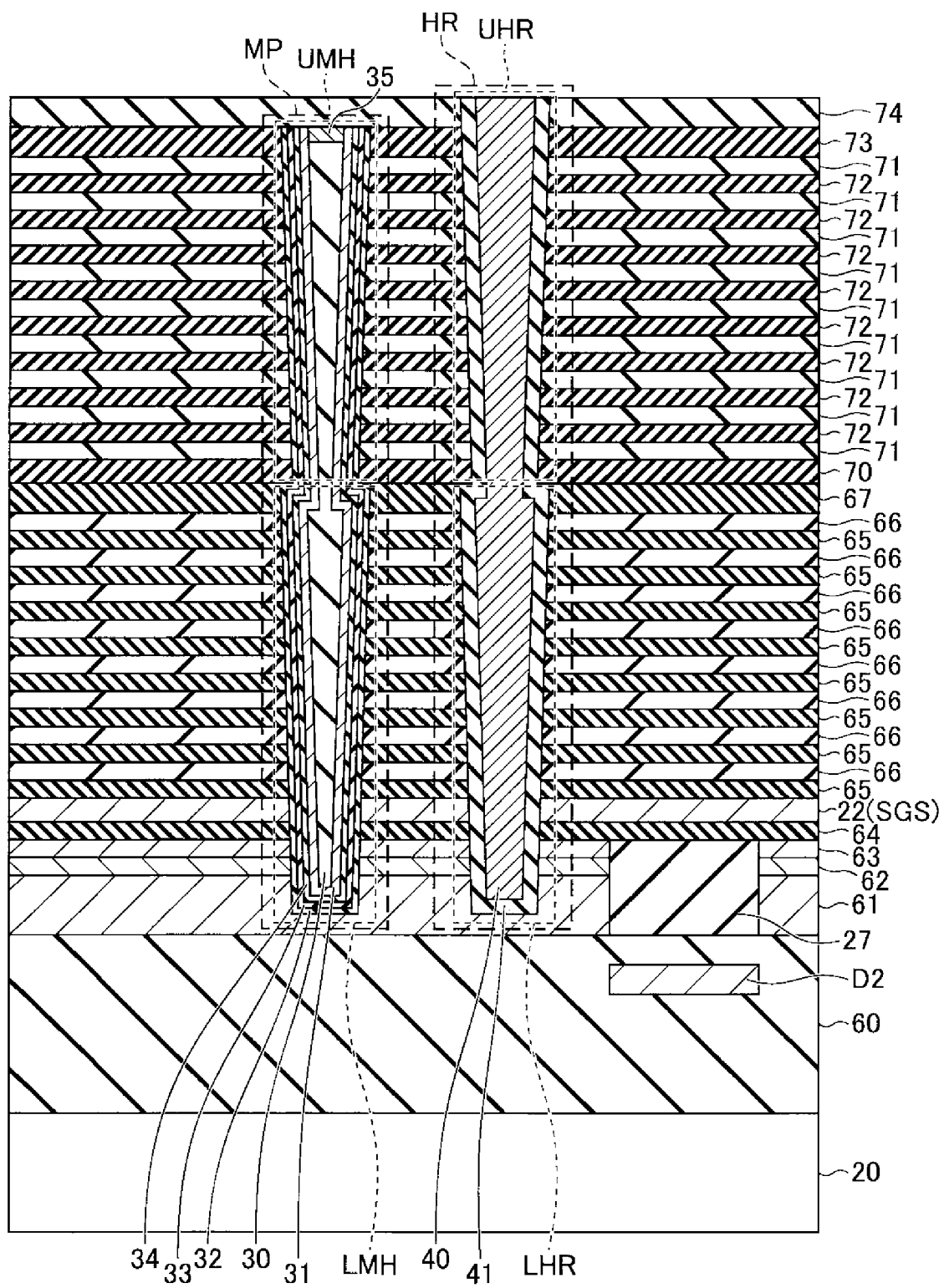
FIG. 19 is a cross-sectional view of the memory cell array showing an example of the process for manufacturing the semiconductor memory device according to the embodiment.

Next, as shown in FIG. 19, the support pillar HR is formed. Specifically, first, the sacrifice member 68 formed in the hole LHR is removed by wet etching, etc. Thereafter, the insulation film 41 and the conductor layer 40 are formed in the holes LHR and UHR. Then, the insulation film 41 and the conductor layer 40 formed above the top surface of the insulator layer 74 are removed by, for example, CMP.

Next, as shown in FIG. 20, the contact hole C4H is formed. Specifically, first, the insulator layer 75 is formed on the top surfaces of the insulator layer 74 and the support pillar HR. Next, a mask is formed by photolithography, etc. in which an area corresponding to the contact hole C4H is opened. Then, by anisotropic etching using the formed mask, the contact hole C4H is formed.

The contact hole C4H formed in this process passes through the insulator layers 27, 64, 65, 67, 70, 72, 73, 74 and 75, the sacrifice members 66 and 71, and the conductor layer 22, and at the bottom of the contact hole C4H, a part of the conductor layer D2 in the insulator layer 60 is exposed. The anisotropic etching in this process is, for example, RIE. The insulator layer 75 contains, for example, silicon oxide.

Figure 21:
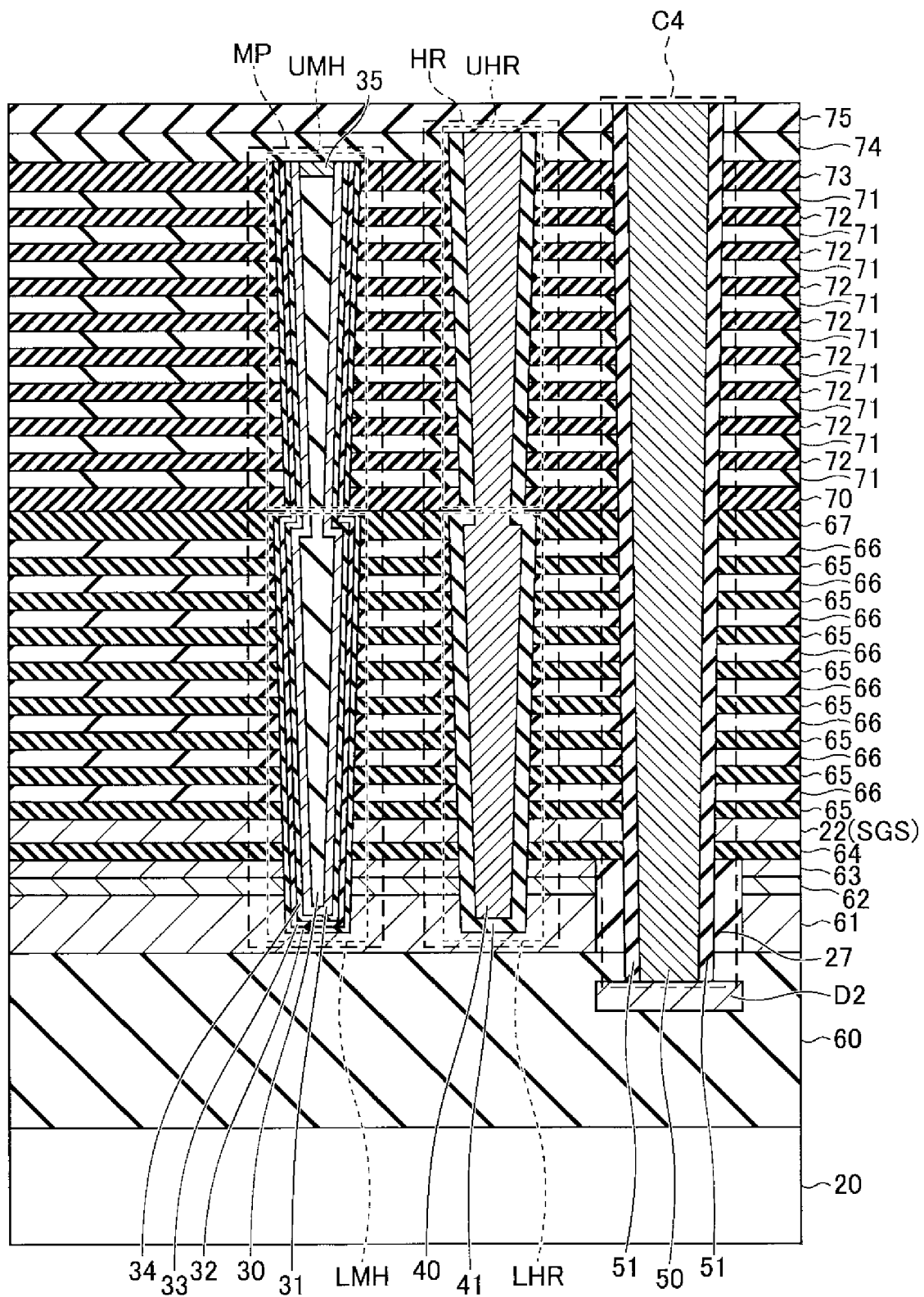
FIG. 21 is a cross-sectional view of the memory cell array showing an example of the process for manufacturing the semiconductor memory device according to the embodiment.

Next, as shown in FIG. 21, the contact C4 is formed. Specifically, first, the insulation film 51 is formed in the contact hole C4H. The insulation film 51 formed at the bottom of the contact hole C4H is removed so as to expose the conductor layer D2. Then, the conductor layer 50 is filled in the contact hole C4H, and the insulation film 51 and the conductor layer 50 formed above the top surface of the insulator layer 75 are removed by, for example, CMP.

Figure 22:
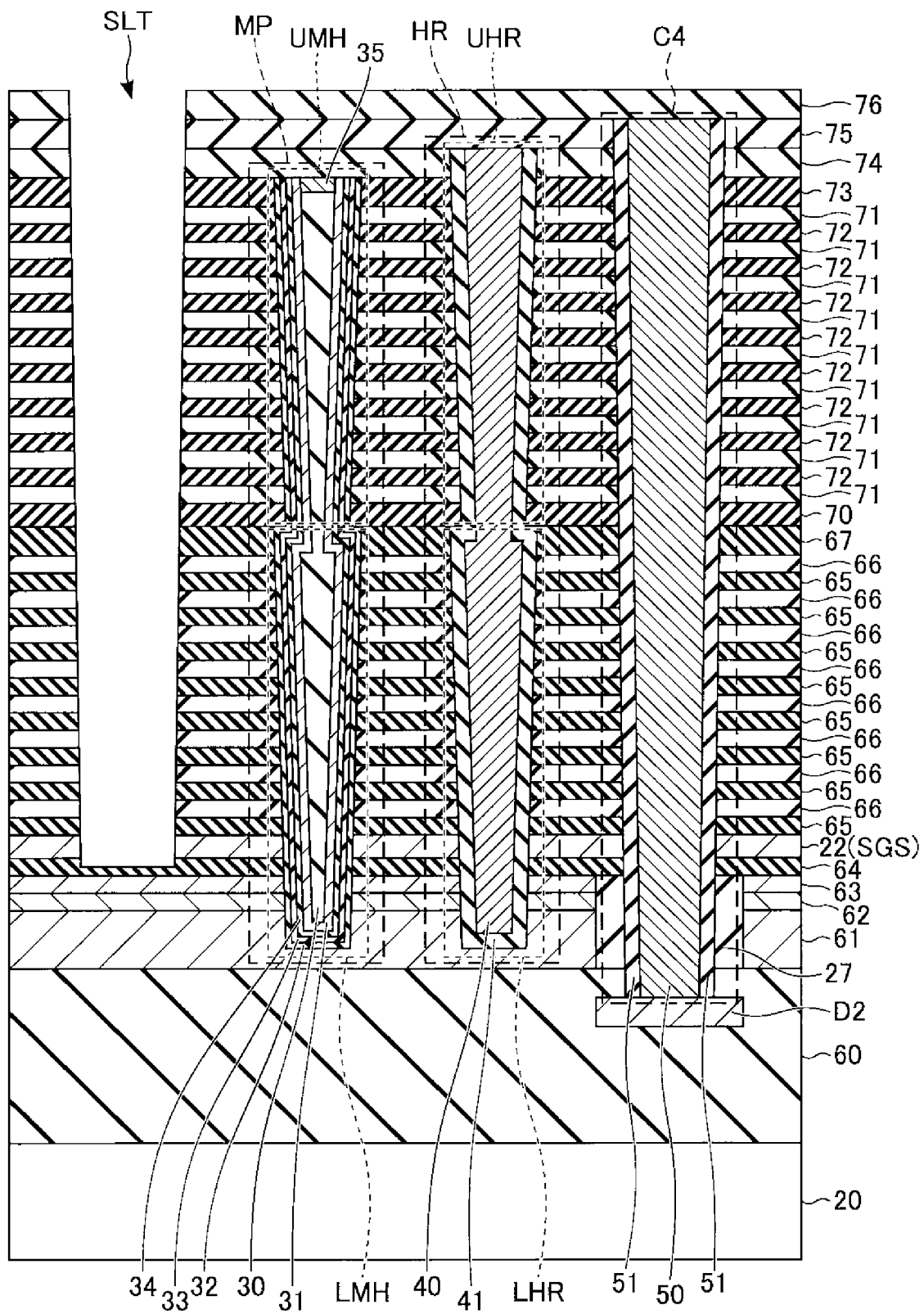
FIG. 22 is a cross-sectional view of the memory cell array showing an example of the process for manufacturing the semiconductor memory device according to the embodiment.

Next, the replacement process for the source line portion is performed. In the replacement process for the source line portion, the insulator layer 76 is formed on the top surfaces of the insulator layer 75 and the contact C4. Next, a mask is formed by photolithography, etc. in which an area corresponding to the slit SLT is opened. Then, by anisotropic etching using the formed mask, the slit SLT is formed as shown in FIG. 22.

The slit SLT formed in this process passes through the insulator layers 65, 67, 70, 72, 73, 74, 75 and 76, the sacrifice members 66 and 71, and the conductor layer 22, and has the bottom that is terminated inside the insulator layer 64. The anisotropic etching in this process is, for example, RIE. The insulator layer 76 contains, for example, silicon oxide.

Figure 23:
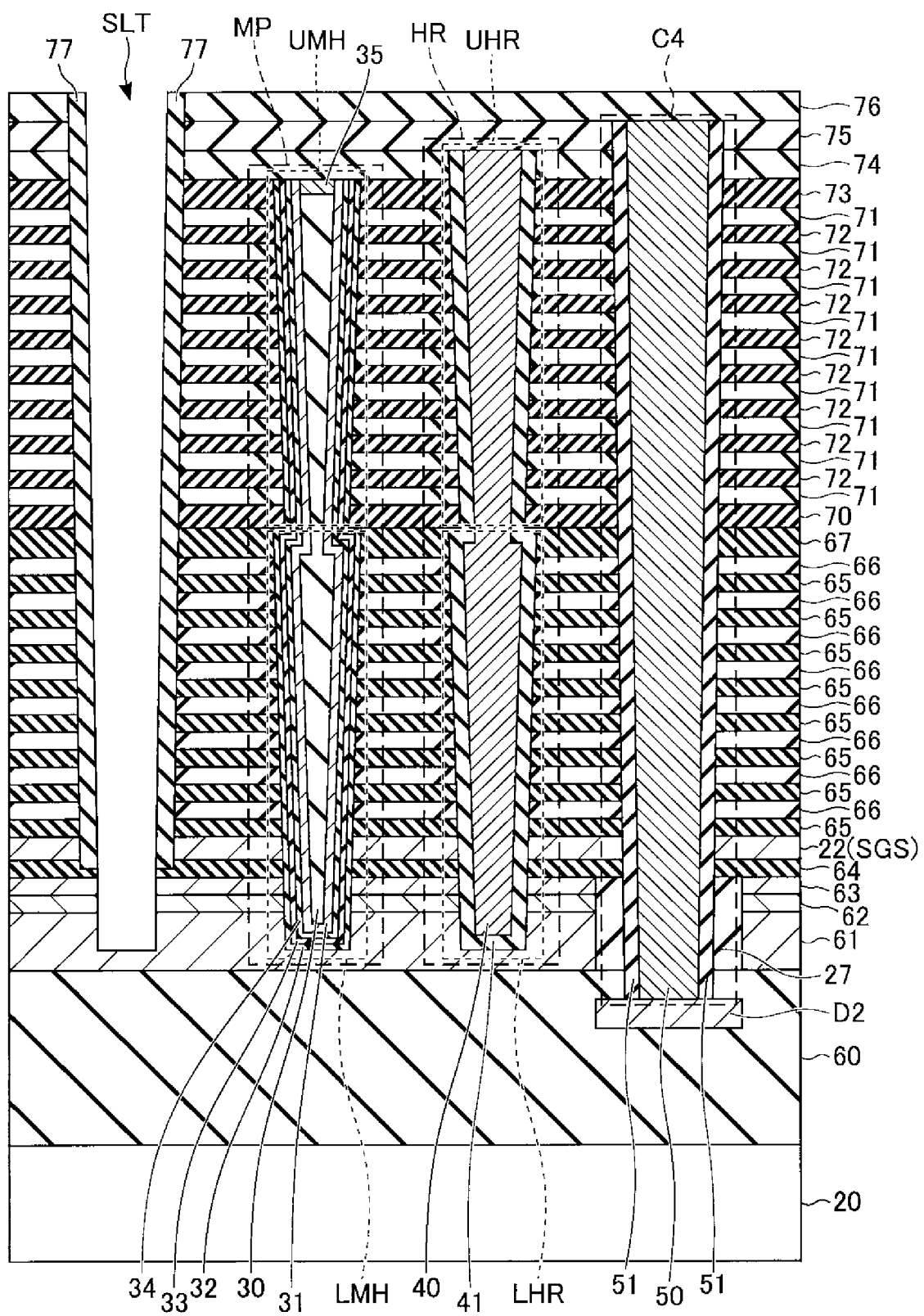
FIG. 23 is a cross-sectional view of the memory cell array showing an example of the process for manufacturing the semiconductor memory device according to the embodiment.

The spacer 77 is formed on the top surface of the insulator layer 76 and the inner wall of the slit SLT by chemical vapor deposition (CVD), for example. For the spacer 77, silicon nitride is formed, for example. By RIE, for example, as shown in FIG. 23, the spacer 77 formed on the top surface of the insulator layer 76 and the spacer 77 formed at the bottom of the slit SLT are removed. Thereby, a side wall of silicon nitride is formed on the side surface of the slit SLT.

Etching to remove the spacer 77 formed at the bottom of the slit SLT is continued after the removal of the spacer 77 formed at the bottom of the slit SLT. As a result, by the etching, the bottom of the slit SLT reaches the layer in which the sacrifice member 62 is formed, for example. The slit SLT in this process may pass through the sacrifice member 62, or the bottom of the slit SLT may reach the inside layer in which the conductor layer 61 is formed. The slit SLT in this process may reach at least the sacrifice member 62.

By performing etching through the slit SLT, the sacrifice member 62 is selectively removed. As a result, at the lower end of the memory pillar MP, the side surface of the block insulation film 34 is exposed, and at the lower end of the support pillar HR, the side surface of the insulation film 41 is exposed. Next, etching is performed through the space obtained by removing the sacrifice member 62 to thereby remove a part of each of the block insulation film 34, the insulation film 33 and the tunnel insulation film 32 as well as a part of the insulation film 41 exposed in the space. As a result, as shown in FIG. 24, at the lower end of the memory pillar MP, a part of the side surface of the semiconductor layer 31 is exposed, and at the lower end of the support pillar HR, a part of the side surface of the conductor layer 40 is exposed.

Figure 25:
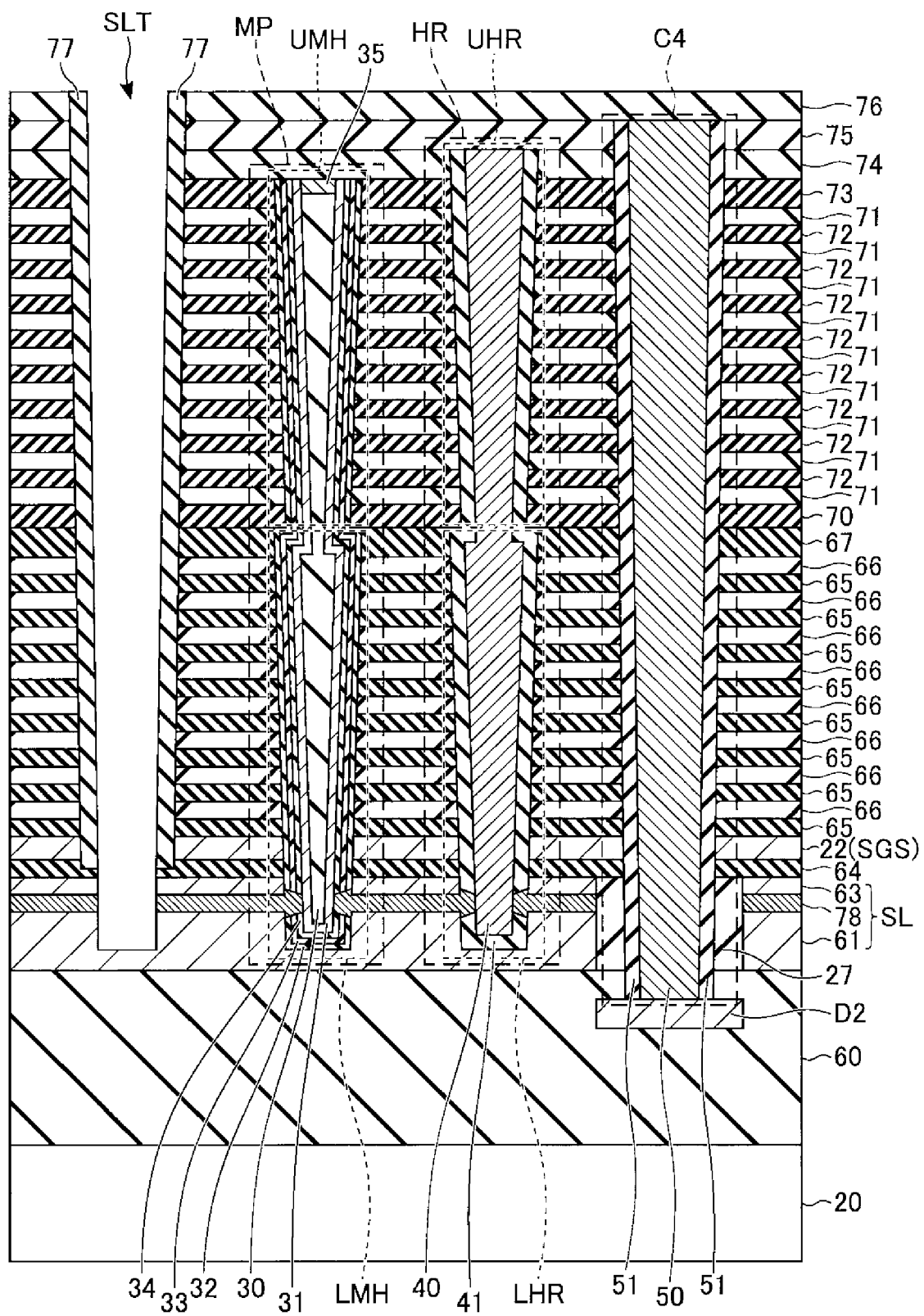
FIG. 25 is a cross-sectional view of the memory cell array showing an example of the process for manufacturing the semiconductor memory device according to the embodiment.

Thereafter, the conductor layer 78 is formed in the space obtained by removal of the sacrifice member 62, a part of each of the block insulation film 34, the insulation film 33 and the tunnel insulation film 32, and a part of the insulation film 41, and etching back is performed subsequently. As a result, as shown in FIG. 25, the semiconductor layer 31 of the memory pillar MP, the conductor layer 40 of the support pillar HR, and the source line portion (a group of the conductor layers 61, 78 and 63) are electrically coupled. For the conductor layer 78, polysilicon with phosphorus doped therein is formed.

Next, the replacement process for the stacked interconnect portion is performed. In the replacement process for the stacked interconnect portion, first, the surfaces of the conductor layers 61, 78 and 63 (polysilicon film) exposed in the slit SLT are oxidized to form an oxide protective film (not shown). Thereafter, the spacer 77 and the sacrifice members 66 and 71 are removed, as shown in FIG. 26, by wet etching using thermal phosphoric acid. In the structure in which the sacrifice members 66 and 71 are removed, the three-dimensional configuration thereof is maintained by the memory pillar MP and the support pillar HR, for example. If the oxide protective film is formed on the surface of the polysilicon film, the oxide protective film is not formed on the surface of the spacer 77. That is, when the oxide protective film is formed in this process, selective oxidation is performed, for example.

Then, conductors corresponding to the conductor layers 23, 24 and 25 are formed by, for example, CVD, in the space obtained by removal of the sacrifice members 66 and 71. For the conductors corresponding to the conductor layers 23, 24 and 25, for example, a metallic film of tungsten or the like may be filled after a block film of aluminum oxide ($Al_2O_3$) is formed.

Then, the conductors formed in the slit SLT are removed by, for example, wet etching, and the plurality of conductor layers 23, 24 and 25 provided in different layers are separated from one another. As a result, as shown in FIG. 27, for example, the conductor layers 23 corresponding respectively to the word lines WL0 to WL7, the conductor layers 24 corresponding respectively to the word lines WL8 to WL15, and the conductor layer 25 corresponding to the select gate line SGD are formed.

Thereafter, as shown in FIG. 28, the insulator 79 is formed in the slit SLT. In this process, silicon nitride, etc. may be formed as a side wall of the slit SLT before the insulator 79 is filled in the slit SLT.

In the manufacturing process described above, the NAND string NS, the source line SL coupled to the NAND string NS, the select gate lines SGS and SGD, the word lines WL, the support pillar HR, and the contact C4 are formed. It should be noted that the manufacturing process has been described as an example, and other processes may be inserted between processes described.

[3] Advantages of Embodiment

The semiconductor memory device 1 according to the embodiment described above makes it possible to improve the yield of the semiconductor memory device 1. The following is a detailed description of the advantages of the semiconductor memory device 1 according to the embodiment.

The semiconductor memory device with three-dimensionally stacked memory cells is provided with the stacked interconnects including, for example, the source line SL, the select gate line SGS, the word lines WL, and the select gate line SGD, above the semiconductor substrate. The memory pillar MP is provided to pass through the stacked interconnects above the source line SL, and is electrically coupled to the source line SL arranged in the lowermost layer. As described, in the semiconductor memory device in which the memory cell array is provided above the semiconductor substrate, the interconnect for applying the voltage to the source line SL may be provided below the memory cell array, i.e., between the semiconductor substrate and the source line SL.

In the process of manufacturing the memory cell array having the stacked interconnects, the replacement process for the stacked interconnects is performed, for example. In the replacement process for the stacked interconnects, first, the sacrifice member and the insulator layer are alternatively arranged. Next, for example, after formation of the memory pillar MP, the support pillar HR and the contact C4 in the stacked structure, the sacrifice members are removed, and the conductors are formed in the space obtained by removal of the sacrifice members. The three-dimensional configuration in the cell area CA when the sacrifice members are removed is maintained by the plurality of memory pillars MP, while the three-dimensional configuration in the contact area C4*tap* is maintained by the plurality of support pillars HR and the plurality of contacts C4.

Moreover, for electrically coupling the source line SL and the interconnect below the memory cell array, the semiconductor memory device including the interconnect below the memory cell array uses the contact that is coupled to the source line SL and passes through the stacked interconnects above the source line SL, and the contact C4 that is coupled to the interconnect below the memory cell array and has the upper end higher than the uppermost interconnect (select gate line SGD) in the stacked interconnects including the source line SL. The source line SL is electrically coupled to the interconnect below the memory cell array by passing through these two types of contacts and the interconnect above the memory cell array.

The two types of contacts for coupling the source line SL and the interconnect below the memory cell array are provided in such a manner that one is provided on the source line SL while the other is provided on the interconnect below the memory cell array. The two types of contacts are each formed in a hole having a depth corresponding to the height of the stacked interconnect, and preferably formed by the same process for reducing the manufacturing costs. That is, when the two types of contacts are formed by the same process, two types of contact holes having different target bottom positions are formed at the same time. However, etching to form such two types of contact holes is difficult, and there may be variations in bottom positions of the contact holes. There is a concern that a failure may occur resulting from the source line SL due to the variations and the yield of the semiconductor memory device is lowered.

In contrast, the semiconductor memory device 1 according to the embodiment uses the plurality of support pillars HR provided in the contact area C4*tap* as the contacts for electrically coupling the source line SL and the interconnect below the memory cell array. Specifically, in the semiconductor memory device 1 according to the embodiment, the plurality of support pillars HR are provided to overlap with the source line SL, and each of the support pillars HR includes the conductor layer 40 provided to pass through the stacked interconnects. Each of the conductor layers 40 is electrically coupled to the source line SL via the side surface, in a manner similar to the memory pillar MP, in the layer in which the source line SL (conductor layer 21) is provided.

In addition, the support pillars HR include one to which the contact HRC is coupled at the top and one to which an upper contact is not coupled. The support pillar HR to which the contact HRC is coupled is electrically coupled to the contact C4 that passes through the stacked interconnects and that is coupled to the interconnect below the memory cell array. Namely, in the semiconductor memory device 1 according to the embodiment, the source line SL (conductor layer 21) is electrically coupled to the source line drive circuit (e.g., driver module 14) via the contact C4 and the support pillar HR to which the contact HRC is coupled.

As a result, the semiconductor memory device 1 according to the embodiment can drive the source line SL via the support pillar HR. In addition, the method of manufacturing the semiconductor memory device 1 according to the embodiment uses the support pillars HR as the contacts for the source line SL, and therefore the target position of the bottom of the contact hole C4H can be one type in the process of forming the contact hole C4H corresponding to the contact C4. Thus, the method of manufacturing the semiconductor memory device 1 according to the embodiment can reduce the difficulty in processing the contact hole C4H and can improve the yield.

The conductor layer 40 included in the support pillar HR is electrically coupled to the source line SL via the side surface in the layer in which the source line SL is provided. This is similar to the coupling between the semiconductor layer 31 included in the memory pillar MP and the source line SL. That is, the process for coupling the conductor layer 40 included in the support pillar HR to the source line SL and the process for coupling the semiconductor layer 31 included in the memory pillar MP to the source line SL can be performed by the same process. Thus, the method of manufacturing the semiconductor memory device 1 according to the embodiment can reduce the manufacturing processes and can suppress the manufacturing costs.

If the semiconductor memory device 1 has the memory pillar MP in which two or more pillars are connected, i.e., the first portion formed in the lower memory hole LMH and the second portion formed in the upper memory hole UMH, for example, the support pillar HR is formed in a manner similar to the memory pillar MP to have the structure in which two or more pillars are connected. In this case, the process for the hole LHR passing through the lower stacked interconnects and corresponding to the support pillar HR and the process for the memory hole LMH may be collectively performed. Since the method of manufacturing the semiconductor memory device 1 according to the embodiment shares some processes of formation of the support pillar HR and the memory pillar MP in common, it is possible to reduce the manufacturing processes and to suppress the manufacturing costs.

In addition, in the semiconductor memory device 1 according to the embodiment, the plurality of support pillars HR electrically coupled to the source line SL are electrically coupled to one interconnect IC via the contacts HRC provided on the respective support pillars HR, and are electrically coupled to the contact C4 via the interconnect IC. That is, in the electric coupling between the source line SL and the contact C4, the plurality of support pillars HR are coupled in parallel to the common interconnect IC. For example, if some processes of formation of the support pillar HR and the memory pillar MP are shared, in general, the outer diameter of the support pillar HR is set to be smaller than the outer diameter of the contact C4; since the plurality of support pillars HR used as the contacts for the source line SL are coupled in parallel, the electrical resistance in the current path between the source line SL and the contact C4 is suppressed. Moreover, by electrically coupling the conductor layer 40 included in the support pillar HR to the source line SL via the side surface of the conductor layer 40, it is possible to ensure the contact area in the Z direction between the conductor layer 40 and the source line SL regardless of the outer diameter of the support pillar HR, and to reduce the contact resistance in the contact surface with the source line SL of each support pillar HR.

The plurality of support pillars HR described above are members used as pillars to maintain the three-dimensional configuration when the replacement process of the stacked interconnects is carried out. The semiconductor memory device 1 according to the embodiment uses a part of the plurality of support pillars HR as contacts for electrically coupling the source line drive circuit and the source line SL. That is, the semiconductor memory device 1 according to the embodiment can be realized by the minimum design change, and can suppress the increase in the area of the memory cell array 10 as well as the manufacturing costs.

[4] Other Modifications

In the above-described embodiment, the memory cell array 10 may have other configurations. For example, the memory pillar MP may be formed of a single pillar with no connection, or may be formed of three or more pillars connected in the Z direction. Moreover, the memory pillar MP may have a structure in which a pillar corresponding to the select gate line SGD and a pillar corresponding to the word line WL are connected. The inside of the slit SLT may be made of various types of insulators. The number of bit lines BL overlapping with each memory pillar MP may be determined as appropriate.

FIG. 29 is an example of a cross-sectional structure in a cell CA area and a contact area C4*tap* of a semiconductor memory device according to a first modification of the embodiment, and corresponds to a region similar to the region shown in FIG. 8. As shown in FIG. 29, the memory pillar MP and the support pillars HR each may be in contact with the conductor layer 21 at the bottom.

Specifically, in the embodiment described above, the semiconductor layer 31 and the conductor layer 21 are electrically coupled via the side contact portion SC1 provided on the side surface of the memory pillar MP; however, the semiconductor layer 31 and the conductor layer 21 may be electrically coupled via the bottom of the memory pillar MP. In this case, a part of each of the tunnel insulation film 32, the insulation film 33 and the block insulation film 34 formed at the bottom of the memory pillar MP is removed, and via this portion, the semiconductor layer 31 and the conductor layer 21 are in contact with each other.

For the support pillars HR, a similar modification can be made. In the embodiment described above, the conductor layers 40 and 21 are electrically coupled via the side contact portion SC2 provided on the side surface of the support pillar HR; however, the conductor layers 40 and 21 may be electrically coupled via the bottom of the support pillar HR. In this case, a part of the insulation film 41 formed at the bottom of the support pillar HR is removed, and via this portion, the conductor layers 40 and 21 are in contact with each other.

Figure 30:
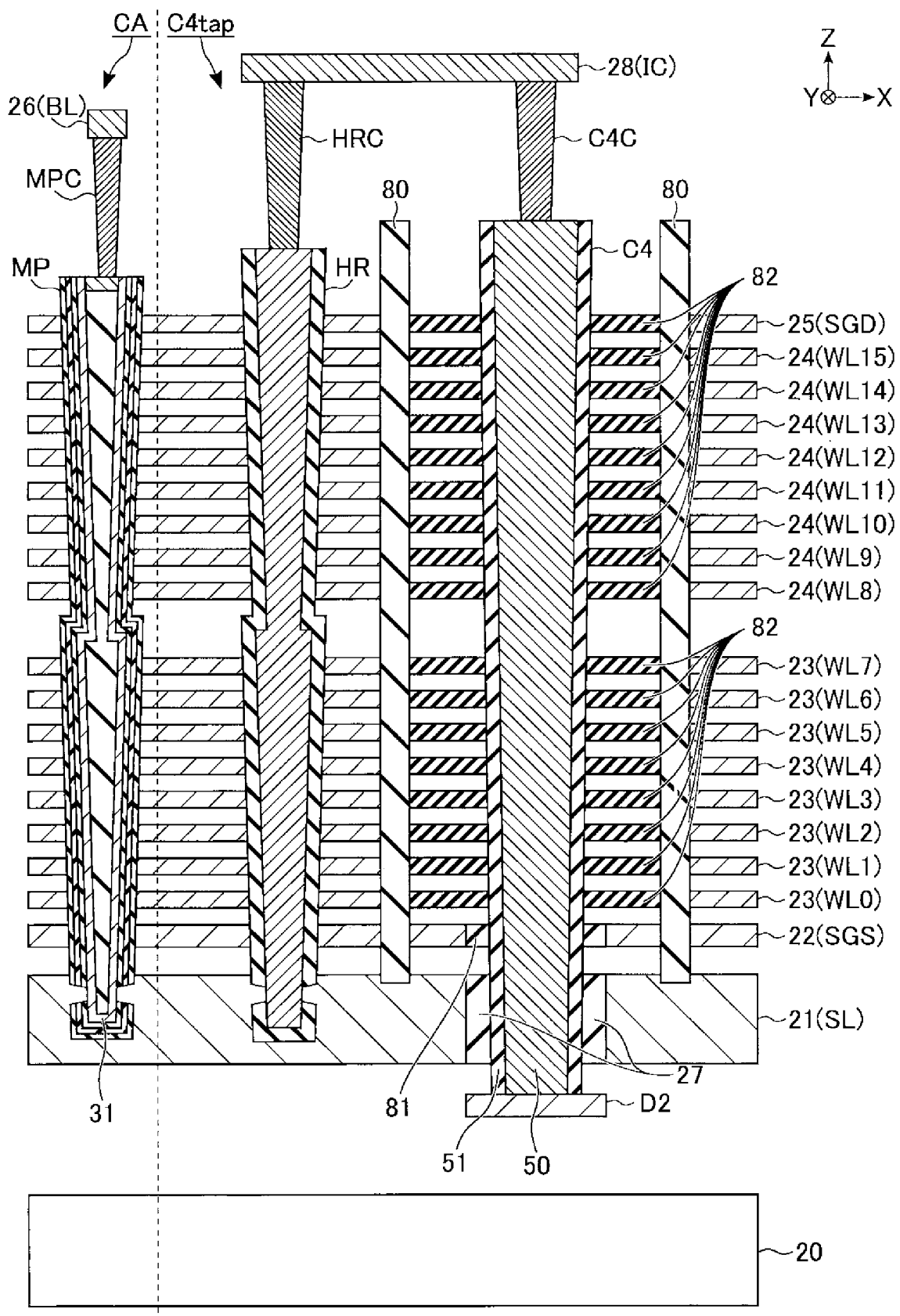
FIG. 30 is a cross-sectional view showing an example of a cross-sectional structure in a cell area and a contact area of a semiconductor memory device according to a second modification of the embodiment.

FIG. 30 is an example of a cross-sectional structure in a cell area CA and a contact area C4*tap* of a semiconductor memory device 1 according to a second modification of the embodiment. As shown in FIG. 30, the second modification has a different cross-sectional structure in the region PR including the contact area C4 described with reference to FIG. 7 from the structure of the contact area C4*tap* shown in the embodiment.

Specifically, the slit 80 filled with an insulator, for example, is provided around the contact C4. The slit 80 locally divides the interconnect layers at least provided with the conductor layers 23 to 25 in the region PR including the contact C4 between the slits SLT adjacent in the Y direction. In each of the interconnect layers provided with the conductor layers 23 to 25, the portion surrounded by the slit 80 is provided with an insulator layer 82. The insulator layer 82 is, for example, the sacrifice member 66 or 71 that is removed by the replacement process of the stacked interconnects described in the embodiment, and corresponds to the sacrifice member 66 or 71 remaining in the portion surrounded by the slit 80 by causing the insulator in the slit 80 to function as a stopper at the time of the replacement process of the stacked interconnects. The embodiment is not limited to this, and the insulator layer 82 may be another insulation member (e.g., oxide film) filled in the space obtained by removal of the sacrifice members 66 and 71. In the conductor layer 22, the region overlapping with the insulator layer 27 in the plane view may be replaced with the insulator layer 81. Furthermore, the insulation film 51 may be omitted.

As described above, the contact C4 may not directly pass through the conductor layers 22 to 25 as in the embodiment, and may be provided to pass through the insulator layers 81 and 82. In the embodiment described above, the structure around the contact C4 can be changed as appropriate.

In the manufacturing method described in the embodiment, the support pillar HR is formed after the memory pillar MP is formed; however, the method is not limited to this. The memory pillar MP may be formed after the support pillar HR is formed. In this case, the memory pillar MP may be higher than the support pillar HR.

In the embodiment described above, circuits such as the sense amplifier module 16 are provided below the memory cell array 10 of the semiconductor memory device 1; however, the configuration is not limited to this. For example, the semiconductor memory device 1 may have a structure in which a chip provided with the sense amplifier module 16, etc. and a chip provided with the memory cell array 10 are bonded to each other.

In the embodiment described above, the word line WL and the select gate line SGS are adjacent while the word line WL and the select gate line SGD are adjacent; however, the configuration is not limited to this. For example, a dummy word line corresponding to a dummy transistor may be provided between the uppermost word line WL and the select gate line SGD. Similarly, a dummy word line may be provided between the lowermost word line WL and the select gate line SGS. Furthermore, a conductor layer at the vicinity of the contact portion of the memory pillars MP connected in the Z direction may be used as a dummy word line.

In the drawings referred to in the description of the above embodiment, the support pillar HR or the contact C4 has a tapered shape, but the embodiment is not limited to this. For example, the support pillar HR or the contact C4 may have a reversed tapered shape or a shape having a fat middle part. Similarly, the memory pillar MP or the slit SLT may have a reversed tapered shape or a shape having a fat middle part. Moreover, in the embodiment described above, the support pillar HR, the contact C4, and the memory pillar MP each have a circular cross-section; however, the cross-section thereof may be oval, and may be determined as appropriate.

The term "outer diameter" described in this specification indicates, for example, the outer diameter of the block insulation film 34 of the memory pillar MP, the outer diameter of the insulation film 41 of the support pillar HR, or the outer diameter of the insulation film 51 of the contact C4. The outer diameter of one member being larger or smaller than that of the other member indicates the size relation between the outer diameters in the same layer. In other words, the outer diameters of the first and second members in the same cross section parallel to the surface of the semiconductor substrate 20 are used for the comparison of the outer diameters between the first and second members.

The term "height" described in this specification indicates the interval between the surface of the semiconductor substrate 20 and the target portion in the direction vertical to the surface of the semiconductor substrate 20. As a criterion of "height", a structure other than the semiconductor substrate 20 may be used. For example, if the semiconductor memory device 1 has a structure in which the chip provided with the memory cell array 10 and the chip provided with a peripheral circuit such as the sense amplifier module 16 are bonded to each other, the source line SL (conductor layer 21) or the like may be used instead of the semiconductor substrate 20 as a criterion of "height".

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a first conductor layer provided via a first insulator layer above a substrate;
   a stacked structure in which a plurality of second conductor layers are stacked above the first conductor layer and spaced apart from each other in a first direction;
   a pillar penetrating the second conductor layers along the first direction, and including a first semiconductor layer electrically coupled to the first conductor layer and a second insulator layer provided between the first semiconductor layer and the second conductor layers of the stacked structure, intersections of the pillar with the second conductor layers functioning as memory cell transistors;
   a plurality of insulating members provided in a plurality of slits each extending in a second direction intersecting the first direction in the second conductor layers of the stacked structure and dividing the stacked structure into a plurality of fully separated regions of the stacked structure in a third direction intersecting the first direction and the second direction;
   a plurality of conductive members penetrating the second conductor layers along the first direction in which top surfaces thereof differing in height from a top surface of the pillar, each of the conductive members including a third conductor layer partially in contact with the first conductor layer and a third insulator layer provided between the third conductor layer and the second conductor layers of the stacked structure; and
   an upper contact provided on the third conductor layer of a first one of the conductive members,
   wherein no upper contact is provided on the third conductor layer of a second one of the conductive members, the first one and the second one of the conductive members both penetrating the stacked structure within a first region among the regions positioned between two insulating members adjacent in the third direction among the insulating members, a portion of the stacked structure within the first region being provided between the first one and the second one of the conductive members.

2. The device of claim 1, wherein the third conductor layer contains tungsten.

3. The device of claim 1, wherein the third insulator layer contains silicon oxide.

4. The device of claim 1, wherein the top surfaces of the conductive members are higher than the top surface of the pillar.

5. The device of claim 1, wherein no upper contact is provided on respective third conductor layers of two or more conductive members among the conductive members, and the third conductor layers of the two or more conductive members are electrically coupled to each other on a side of lower ends of the third conductor layers.

6. The device of claim 5, wherein the two or more conductive members are aligned in the second direction.

7. The device of claim 5, wherein the first conductor layer functions as a source layer and the third conductor layers of the two or more conductive members are electrically coupled to each other in a same level as the source layer in the first direction.

8. The device of claim 1, wherein a plurality of types of insulators are provided in the slits.

9. The device of claim 8, wherein the plurality of types of insulators in the slits include silicon oxide and silicon nitride formed on a side wall of the silicon oxide.

10. The device of claim 1, further comprising a drive circuit provided below the first conductor layer.

11. A semiconductor memory device, comprising:
    a first conductor layer provided via a first insulator layer above a substrate;
    a stacked structure in which a plurality of second conductor layers are stacked above the first conductor layer and spaced apart from each other in a first direction;
    a pillar fully penetrating the second conductor layers along the first direction, and including a first semiconductor layer electrically coupled to the first conductor layer and a second insulator layer provided between the first semiconductor layer and the second conductor layers of the stacked structure, intersections of the pillar with the second conductor layers functioning as memory cell transistors;
    a plurality of conductive members fully penetrating the second conductor layers along the first direction in which top surfaces thereof differing in height from a top surface of the pillar, each of the conductive members including a third conductor layer partially in contact with the first conductor layer and a third insulator layer provided between the third conductor layer and the second conductor layers of the stacked structure; and
    a plurality of upper contacts provided on third conductor layers of first and second conductive members among the conductive members, the first and second conductive members being aligned in a second direction intersecting the first direction,
    wherein no upper contact is provided on third conductor layers of third and fourth conductive members among the conductive members, the third and fourth conductive members being aligned in the second direction, the third conductor layers of the first and second conductive members are spaced apart from the third conductor layers of the third and fourth conductive members respectively, and positions of the third and fourth conductive members are shifted from positions of the first and second conductive members in a third direction intersecting the first direction and the second direction.

12. The device of claim 11, wherein the third conductor layer contains tungsten.

13. The device of claim 11, wherein the third insulator layer contains silicon oxide.

14. The device of claim 11, wherein the top surfaces of the conductive members are higher than the top surface of the pillar.

15. The device of claim 11, wherein the third conductor layers of the third and fourth conductive members are electrically coupled to each other on a side of lower ends of the third conductor layers.

16. The device of claim 11, wherein the first conductor layer functions as a source layer and the third conductor layers of the third and fourth conductive members are electrically coupled to each other in a same level as the source layer in the first direction.

17. The device of claim 11, further comprising:
    slits each extending in the second direction in the stacked structure and dividing the second conductor layers of the stacked structure into a plurality of parts in the third direction,
    wherein the first to fourth conductive members are arranged between two slits adjacent in the third direction among the slits.

18. The device of claim 17, wherein a plurality of types of insulators are provided in the slits.

19. The device of claim 18, wherein the plurality of types of insulators in the slits include silicon oxide and silicon nitride formed on a side wall of the silicon oxide.

20. The device of claim 11, further comprising a drive circuit provided below the first conductor layer.

* * * * *